United States Patent
Loveland et al.

(10) Patent No.: US 11,727,163 B2
(45) Date of Patent: *Aug. 15, 2023

(54) SYSTEM AND METHOD FOR CONSTRUCTION ESTIMATION USING AERIAL IMAGES

(71) Applicant: Xactware Solutions, Inc., Lehi, UT (US)

(72) Inventors: James Edward Loveland, Alpine, UT (US); Jeffrey Clayton Taylor, Alpine, UT (US); Jeffery Devon Lewis, Orem, UT (US); Bradley McKay Childs, Lehi, UT (US); Corey David Reed, Cedar Hills, UT (US); Jared William Robertson, Orem, UT (US)

(73) Assignee: Xactware Solutions, Inc., Lehi, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/560,718

(22) Filed: Dec. 23, 2021

(65) Prior Publication Data

US 2022/0114300 A1    Apr. 14, 2022

Related U.S. Application Data

(63) Continuation of application No. 16/709,112, filed on Dec. 10, 2019, now Pat. No. 11,210,433, which is a
(Continued)

(51) Int. Cl.
*G06F 30/13* (2020.01)
*G06V 20/10* (2022.01)
(Continued)

(52) U.S. Cl.
CPC .......... *G06F 30/13* (2020.01); *G06F 3/04842* (2013.01); *G06T 3/40* (2013.01);
(Continued)

(58) Field of Classification Search
CPC ...... G06F 30/13; G06F 3/04842; G06F 30/00; G06T 3/40; G06T 5/20; G06T 5/40; G06T 7/33; G06T 17/00; G06V 20/176
See application file for complete search history.

(56) References Cited

U.S. PATENT DOCUMENTS

| | | |
|---|---|---|
| 3,908,281 A | 9/1975 | Fox |
| 4,845,643 A | 7/1989 | Clapp |

(Continued)

FOREIGN PATENT DOCUMENTS

| | | |
|---|---|---|
| AU | 2008/230031 B8 | 7/2010 |
| CA | 2191954 A1 | 12/1995 |

(Continued)

OTHER PUBLICATIONS

Office Action dated Mar. 19, 2019, issued in connection with U.S. Appl. No. 15/621,458 (10 pages).

(Continued)

*Primary Examiner* — Maurice L. McDowell, Jr.
(74) *Attorney, Agent, or Firm* — McCarter & English, LLP

(57) ABSTRACT

A system and method for construction estimation using aerial images is provided. The system receives at least one aerial image of a building. An estimation engine processes the aerial image at a plurality of angles to automatically identify a plurality (e.g., perimeter and interior) lines in the image corresponding to a plurality of features of a roof the building. The estimation engine allows users to generate two-dimensional and three-dimensional models of the roof by automatically delineating various roof features, and generates a report including information about the roof of the building.

16 Claims, 17 Drawing Sheets

Related U.S. Application Data continuation of application No. 15/358,870, filed on Nov. 22, 2016, now Pat. No. 10,503,842, which is a continuation of application No. 13/397,325, filed on Feb. 15, 2012, now Pat. No. 9,501,700.

(51) Int. Cl.
| | |
|---|---|
| *G06T 17/00* | (2006.01) |
| *G06T 7/33* | (2017.01) |
| *G06F 3/04842* | (2022.01) |
| *G06T 3/40* | (2006.01) |
| *G06T 5/20* | (2006.01) |
| *G06T 5/40* | (2006.01) |
| *G06F 30/00* | (2020.01) |

(52) U.S. Cl.
CPC .............. *G06T 5/20* (2013.01); *G06T 5/40* (2013.01); *G06T 7/33* (2017.01); *G06T 17/00* (2013.01); *G06V 20/176* (2022.01); *G06F 30/00* (2020.01)

(56) References Cited

U.S. PATENT DOCUMENTS

| | | | |
|---|---|---|---|
| 5,247,356 | A | 9/1993 | Ciampa |
| 5,259,037 | A | 11/1993 | Plunk |
| 5,276,866 | A | 1/1994 | Paolini |
| 5,422,989 | A | 6/1995 | Bell et al. |
| 5,592,375 | A | 1/1997 | Salmon et al. |
| 5,633,995 | A | 5/1997 | McClain |
| 5,666,441 | A | 9/1997 | Rao et al. |
| 5,727,138 | A | 3/1998 | Harada |
| 5,983,010 | A | 11/1999 | Murdock et al. |
| 6,037,945 | A | 3/2000 | Loveland |
| 6,046,745 | A | 4/2000 | Moriya et al. |
| 6,134,338 | A | 10/2000 | Solberg et al. |
| 6,198,431 | B1 | 3/2001 | Gibson |
| 6,323,885 | B1 | 11/2001 | Wiese |
| 6,333,749 | B1 | 12/2001 | Reinhardt et al. |
| 6,342,884 | B1 | 1/2002 | Kamen et al. |
| 6,356,280 | B1 | 3/2002 | Kamen et al. |
| 6,385,541 | B1 | 5/2002 | Blumberg et al. |
| 6,396,491 | B2 | 5/2002 | Watanabe et al. |
| 6,434,277 | B1 | 8/2002 | Kamada et al. |
| 6,446,053 | B1 | 9/2002 | Elliott |
| 6,448,964 | B1 | 9/2002 | Isaacs et al. |
| 6,456,287 | B1 | 9/2002 | Kamen et al. |
| 6,496,184 | B1 | 12/2002 | Freeman et al. |
| 6,525,728 | B2 | 2/2003 | Kamen et al. |
| 6,556,195 | B1 | 4/2003 | Totsuka et al. |
| 6,581,045 | B1 | 6/2003 | Watson |
| 6,636,803 | B1 | 10/2003 | Hartz, Jr. et al. |
| 6,810,383 | B1 | 10/2004 | Loveland |
| 6,816,819 | B1 | 11/2004 | Loveland |
| 6,826,539 | B2 | 11/2004 | Loveland |
| 6,829,584 | B2 | 12/2004 | Loveland |
| 6,836,270 | B2 | 12/2004 | Du |
| 6,912,293 | B1 | 6/2005 | Korobkin |
| 6,980,690 | B1 | 12/2005 | Taylor et al. |
| 6,982,712 | B2 | 1/2006 | Onto |
| 7,003,400 | B2 | 2/2006 | Bryant |
| 7,006,977 | B1 | 2/2006 | Attra et al. |
| 7,098,909 | B2 | 8/2006 | Hayano et al. |
| 7,133,551 | B2 | 11/2006 | Chen et al. |
| 7,149,346 | B2 | 12/2006 | Oniyama |
| 7,164,883 | B2 | 1/2007 | Rappaport et al. |
| 7,187,452 | B2 | 3/2007 | Jupp et al. |
| 7,246,044 | B2 | 7/2007 | Imamura et al. |
| 7,305,983 | B1 | 12/2007 | Meder et al. |
| 7,324,666 | B2 | 1/2008 | Zoken et al. |
| 7,343,268 | B2 | 3/2008 | Kishikawa |
| 7,376,284 | B2 | 5/2008 | Tao et al. |
| 7,386,164 | B2 | 6/2008 | Shragai et al. |
| 7,421,125 | B1 | 9/2008 | Rees |
| 7,424,133 | B2 | 9/2008 | Schultz et al. |
| 7,444,013 | B2 | 10/2008 | Chen |
| 7,487,114 | B2 | 2/2009 | Florance et al. |
| 7,508,977 | B2 | 3/2009 | Lyons et al. |
| 7,509,241 | B2 | 3/2009 | Guo et al. |
| 7,515,153 | B2 | 4/2009 | Jin et al. |
| 7,519,206 | B2 | 4/2009 | Mulet-Parada et al. |
| 7,720,276 | B1 | 5/2010 | Korobkin |
| 7,728,833 | B2 | 6/2010 | Verma et al. |
| 7,752,018 | B2 | 7/2010 | Rahmes et al. |
| 7,787,659 | B2 | 8/2010 | Schultz et al. |
| 7,804,996 | B2 | 9/2010 | Ohtomo et al. |
| 7,869,981 | B2 | 1/2011 | Pendyala et al. |
| 7,873,238 | B2 | 1/2011 | Schultz et al. |
| 7,920,963 | B2 | 4/2011 | Jouline et al. |
| 7,961,982 | B2 | 6/2011 | Sibiryakov et al. |
| 7,991,226 | B2 | 8/2011 | Schultz et al. |
| 7,995,799 | B2 | 8/2011 | Schultz et al. |
| 7,995,862 | B2 | 8/2011 | Tao et al. |
| 8,040,343 | B2 | 10/2011 | Kikuchi et al. |
| 8,059,888 | B2 | 11/2011 | Chen et al. |
| 8,068,643 | B2 | 11/2011 | Schultz et al. |
| 8,078,396 | B2 | 12/2011 | Meadow et al. |
| 8,078,436 | B2 | 12/2011 | Pershing et al. |
| 8,081,841 | B2 | 12/2011 | Schultz et al. |
| 8,099,264 | B2 | 1/2012 | Kelley et al. |
| 8,131,514 | B2 | 3/2012 | Royan et al. |
| 8,145,578 | B2 | 3/2012 | Pershing et al. |
| 8,154,633 | B2 | 4/2012 | Gloudemans et al. |
| 8,170,840 | B2 | 5/2012 | Pershing |
| 8,204,341 | B2 | 6/2012 | Schultz et al. |
| 8,207,964 | B1 | 6/2012 | Meadow et al. |
| 8,209,152 | B2 | 6/2012 | Pershing |
| 8,233,666 | B2 | 7/2012 | Schultz et al. |
| 8,275,194 | B2 | 9/2012 | Zebedin |
| 8,331,654 | B2 | 12/2012 | Abraham et al. |
| 8,385,672 | B2 | 2/2013 | Giuffrida et al. |
| 8,390,617 | B1 * | 3/2013 | Reinhardt .............. G06T 15/30 |
| | | | 345/419 |
| 8,401,222 | B2 | 3/2013 | Thornberry et al. |
| 8,452,125 | B2 | 5/2013 | Schultz et al. |
| 8,477,190 | B2 | 7/2013 | Giuffrida et al. |
| 8,515,125 | B2 | 8/2013 | Thornberry et al. |
| 8,515,198 | B2 | 8/2013 | Giuffrida et al. |
| 8,520,079 | B2 | 8/2013 | Schultz et al. |
| 8,531,472 | B2 | 9/2013 | Freund et al. |
| 8,542,880 | B2 | 9/2013 | Thornberry et al. |
| 8,588,547 | B2 | 11/2013 | Giuffrida et al. |
| 8,593,518 | B2 | 11/2013 | Schultz et al. |
| 8,630,510 | B2 | 1/2014 | Giuffrida et al. |
| 8,634,594 | B2 | 1/2014 | Schultz et al. |
| 8,634,597 | B2 | 1/2014 | Ivanov et al. |
| 8,643,720 | B2 | 2/2014 | Schultz et al. |
| 8,648,872 | B2 | 2/2014 | Freund et al. |
| 8,649,596 | B2 | 2/2014 | Schultz et al. |
| 8,660,382 | B2 | 2/2014 | Schultz et al. |
| 8,670,961 | B2 * | 3/2014 | Pershing .................. G06T 7/32 |
| | | | 703/2 |
| 8,731,234 | B1 | 5/2014 | Ciarcia et al. |
| 8,774,525 | B2 | 7/2014 | Pershing |
| 8,818,076 | B2 | 8/2014 | Shenkar et al. |
| 8,818,770 | B2 | 8/2014 | Pershing |
| 8,823,732 | B2 | 9/2014 | Adams et al. |
| 8,825,454 | B2 | 9/2014 | Pershing |
| 8,855,442 | B2 | 10/2014 | Owechko |
| 8,897,539 | B2 | 11/2014 | Stone et al. |
| 8,938,090 | B2 | 1/2015 | Thornberry et al. |
| 8,970,615 | B2 | 3/2015 | Freund et al. |
| 8,971,624 | B2 | 3/2015 | Schultz et al. |
| 8,977,520 | B2 | 3/2015 | Stephens et al. |
| 8,995,757 | B1 | 3/2015 | Ciarcia et al. |
| 9,014,415 | B2 | 4/2015 | Chen et al. |
| 9,036,861 | B2 | 5/2015 | Chen et al. |
| 9,047,688 | B2 | 6/2015 | Lynch |
| 9,070,018 | B1 | 6/2015 | Ciarcia et al. |
| 9,129,376 | B2 | 9/2015 | Pershing |
| 9,135,737 | B2 | 9/2015 | Pershing |
| 9,141,880 | B2 | 9/2015 | Ciarcia |
| 9,147,276 | B2 | 9/2015 | Giuffrida et al. |

(56) References Cited

U.S. PATENT DOCUMENTS

| | | |
|---|---|---|
| 9,147,287 B2 | 9/2015 | Ciarcia |
| 9,159,164 B2 | 10/2015 | Ciarcia |
| 9,182,657 B2 | 11/2015 | Schultz et al. |
| 9,183,538 B2 | 11/2015 | Thornberry et al. |
| 9,460,517 B2 | 10/2016 | Fathi et al. |
| 9,501,700 B2 | 11/2016 | Loveland et al. |
| 9,679,227 B2 | 6/2017 | Taylor et al. |
| 9,886,774 B2 | 2/2018 | Fathi et al. |
| 9,904,867 B2 | 2/2018 | Fathi et al. |
| 9,911,228 B2 * | 3/2018 | Pershing ................. G06T 19/20 |
| 10,032,310 B2 | 7/2018 | Fathi et al. |
| 10,140,756 B2 | 11/2018 | Van Der Zwan et al. |
| 10,503,842 B2 | 12/2019 | Loveland et al. |
| 10,540,577 B2 | 1/2020 | Taylor et al. |
| 10,592,765 B2 | 3/2020 | Fathi et al. |
| 10,896,353 B2 | 1/2021 | Taylor et al. |
| 11,094,113 B2 | 8/2021 | Mundy et al. |
| 11,144,795 B2 | 10/2021 | Taylor et al. |
| 11,210,433 B2 | 12/2021 | Loveland et al. |
| 2001/0027404 A1 | 10/2001 | Loveland |
| 2002/0061132 A1 | 5/2002 | Furukawa |
| 2002/0076098 A1 | 6/2002 | Love |
| 2002/0154174 A1 | 10/2002 | Redlich et al. |
| 2002/0167515 A1 | 11/2002 | Kamen et al. |
| 2003/0014224 A1 | 1/2003 | Guo et al. |
| 2003/0023412 A1 | 1/2003 | Rappaport et al. |
| 2003/0028393 A1 | 2/2003 | Coulston et al. |
| 2003/0088362 A1 | 5/2003 | Melero et al. |
| 2003/0115163 A1 | 6/2003 | Moore et al. |
| 2003/0147553 A1 | 8/2003 | Chen et al. |
| 2003/0171957 A1 | 9/2003 | Watrous |
| 2003/0233310 A1 | 12/2003 | Stavrovski |
| 2004/0047498 A1 | 3/2004 | Mulet-Parada et al. |
| 2004/0105573 A1 | 6/2004 | Neumann et al. |
| 2004/0220906 A1 | 11/2004 | Gargi et al. |
| 2004/0263514 A1 | 12/2004 | Jin et al. |
| 2004/0264763 A1 | 12/2004 | Mas et al. |
| 2005/0012742 A1 | 1/2005 | Royan |
| 2005/0102394 A1 | 5/2005 | Loveland |
| 2005/0203768 A1 | 9/2005 | Florance et al. |
| 2005/0288959 A1 | 12/2005 | Eraker et al. |
| 2006/0056732 A1 | 3/2006 | Holmes |
| 2006/0061566 A1 | 3/2006 | Verma et al. |
| 2006/0136126 A1 | 6/2006 | Coombes et al. |
| 2006/0137736 A1 | 6/2006 | Nishitani et al. |
| 2006/0188143 A1 | 8/2006 | Strassenburg-Kleciak |
| 2006/0200311 A1 | 9/2006 | Arutunian et al. |
| 2006/0232605 A1 | 10/2006 | Imamura |
| 2006/0239537 A1 | 10/2006 | Shragai et al. |
| 2006/0262112 A1 | 11/2006 | Shimada |
| 2006/0265287 A1 | 11/2006 | Kubo |
| 2007/0036467 A1 | 2/2007 | Coleman et al. |
| 2007/0067191 A1 | 3/2007 | Loveland |
| 2007/0115284 A1 | 5/2007 | Kim et al. |
| 2007/0150366 A1 | 6/2007 | Yahiro et al. |
| 2007/0220174 A1 | 9/2007 | Abhyanker |
| 2008/0021683 A1 | 1/2008 | Rahmes et al. |
| 2008/0068379 A1 | 3/2008 | Larsen et al. |
| 2008/0071604 A1 | 3/2008 | Scanlan |
| 2008/0089610 A1 | 4/2008 | Tao et al. |
| 2008/0103991 A1 | 5/2008 | Moore et al. |
| 2008/0105045 A1 | 5/2008 | Woro |
| 2008/0162380 A1 | 7/2008 | Suga et al. |
| 2008/0204570 A1 | 8/2008 | Schultz et al. |
| 2008/0221843 A1 | 9/2008 | Shenkar et al. |
| 2008/0231700 A1 | 9/2008 | Schultz et al. |
| 2008/0262789 A1 | 10/2008 | Pershing et al. |
| 2008/0273753 A1 | 11/2008 | Giuffrida et al. |
| 2008/0279447 A1 | 11/2008 | Friedlander et al. |
| 2008/0298638 A1 | 12/2008 | Miyazaki |
| 2008/0310756 A1 | 12/2008 | Tao et al. |
| 2009/0089018 A1 | 4/2009 | Kelley et al. |
| 2009/0110327 A1 | 4/2009 | Chen et al. |
| 2009/0132210 A1 | 5/2009 | Royan et al. |
| 2009/0132436 A1 | 5/2009 | Pershing et al. |
| 2009/0141020 A1 | 6/2009 | Freund et al. |
| 2009/0216501 A1 | 8/2009 | Yeow et al. |
| 2009/0234692 A1 | 9/2009 | Powell et al. |
| 2009/0271154 A1 | 10/2009 | Coad et al. |
| 2009/0304227 A1 | 12/2009 | Kennedy et al. |
| 2009/0310867 A1 | 12/2009 | Matei et al. |
| 2010/0034483 A1 | 2/2010 | Giuffrida et al. |
| 2010/0060631 A1 | 3/2010 | Sugihara |
| 2010/0110074 A1 | 5/2010 | Pershing |
| 2010/0114537 A1 | 5/2010 | Pershing |
| 2010/0164953 A1 | 7/2010 | Wouhaybi et al. |
| 2010/0179787 A2 | 7/2010 | Pershing et al. |
| 2010/0182316 A1 | 7/2010 | Akbari et al. |
| 2010/0201682 A1 | 8/2010 | Quan et al. |
| 2010/0217724 A1 | 8/2010 | Wayne et al. |
| 2010/0241406 A1 | 9/2010 | Rahmes et al. |
| 2010/0275018 A1 | 10/2010 | Pedersen |
| 2010/0296693 A1 | 11/2010 | Thornberry et al. |
| 2010/0303340 A1 | 12/2010 | Abraham et al. |
| 2011/0047048 A1 | 2/2011 | Yahiro et al. |
| 2011/0096083 A1 | 4/2011 | Schultz |
| 2011/0157213 A1 | 6/2011 | Takeyama et al. |
| 2011/0164029 A1 | 7/2011 | King et al. |
| 2011/0187713 A1 | 8/2011 | Pershing et al. |
| 2011/0205245 A1 | 8/2011 | Kennedy et al. |
| 2011/0222757 A1 | 9/2011 | Yeatman, Jr. et al. |
| 2012/0007982 A1 | 1/2012 | Giuffrida et al. |
| 2012/0026322 A1 | 2/2012 | Malka et al. |
| 2012/0101783 A1 | 4/2012 | Stephens et al. |
| 2012/0154446 A1 | 6/2012 | Adams et al. |
| 2012/0170797 A1 | 7/2012 | Pershing et al. |
| 2012/0179431 A1 * | 7/2012 | Labrie ..................... G06F 30/00 703/1 |
| 2012/0183217 A1 | 7/2012 | Schultz et al. |
| 2012/0191424 A1 | 7/2012 | Pershing |
| 2012/0209782 A1 | 8/2012 | Pershing et al. |
| 2012/0223965 A1 | 9/2012 | Pershing |
| 2012/0253725 A1 | 10/2012 | Malka et al. |
| 2012/0253751 A1 | 10/2012 | Malka et al. |
| 2012/0288158 A1 | 11/2012 | Schultz et al. |
| 2013/0113831 A1 | 5/2013 | Giuffrida et al. |
| 2013/0135471 A1 | 5/2013 | Giuffrida et al. |
| 2013/0138401 A1 | 5/2013 | Thornberry et al. |
| 2013/0170694 A1 | 7/2013 | Thornberry et al. |
| 2013/0202157 A1 * | 8/2013 | Pershing ................ G01C 11/04 702/156 |
| 2013/0204575 A1 | 8/2013 | Pershing |
| 2013/0208116 A1 | 8/2013 | Schultz et al. |
| 2013/0208996 A1 | 8/2013 | Schultz et al. |
| 2013/0211790 A1 | 8/2013 | Loveland et al. |
| 2013/0212536 A1 | 8/2013 | Thornberry et al. |
| 2013/0226515 A1 | 8/2013 | Pershing et al. |
| 2014/0064554 A1 | 3/2014 | Coulter et al. |
| 2015/0347872 A1 | 12/2015 | Taylor et al. |
| 2015/0370929 A1 | 12/2015 | Pershing |
| 2016/0129906 A1 | 5/2016 | Chen et al. |
| 2016/0239976 A1 | 8/2016 | Fathi et al. |
| 2016/0260245 A1 | 9/2016 | DeCell et al. |
| 2016/0284090 A1 | 9/2016 | Huang et al. |
| 2016/0343140 A1 | 11/2016 | Ciprari et al. |
| 2017/0154131 A1 | 6/2017 | Loveland et al. |
| 2017/0272727 A1 | 9/2017 | Jiang et al. |
| 2017/0277980 A1 | 9/2017 | Taylor et al. |
| 2017/0353708 A1 | 12/2017 | Petrichkovich et al. |
| 2018/0322698 A1 | 11/2018 | Fathi et al. |
| 2019/0095694 A1 | 3/2019 | Waizenegger et al. |
| 2019/0220711 A1 | 7/2019 | Taylor et al. |
| 2019/0236839 A1 | 8/2019 | Fathi et al. |
| 2020/0082168 A1 | 3/2020 | Fathi et al. |
| 2020/0110847 A1 | 4/2020 | Loveland et al. |
| 2020/0202183 A1 | 6/2020 | Taylor et al. |
| 2021/0174580 A1 | 6/2021 | Mundy et al. |
| 2021/0407188 A1 | 12/2021 | Mundy et al. |
| 2022/0027622 A1 | 1/2022 | Taylor et al. |

FOREIGN PATENT DOCUMENTS

| | | |
|---|---|---|
| CA | 2703423 A1 | 11/2010 |
| DE | 4419359 A1 | 12/1995 |

(56) References Cited

FOREIGN PATENT DOCUMENTS

| | | |
|---|---|---|
| DE | 19719620 A1 | 11/1998 |
| DE | 19857667 A1 | 8/2000 |
| EP | 1010966 A1 | 6/2000 |
| WO | 00/029806 A2 | 5/2000 |
| WO | 2004/044692 A2 | 5/2004 |
| WO | 2005/124276 A2 | 12/2005 |
| WO | 2006/040775 A2 | 4/2006 |
| WO | 2006/090132 A2 | 8/2006 |
| WO | 2009/049151 A1 | 4/2009 |
| WO | 2009/073726 A1 | 6/2009 |
| WO | 2010/017255 A2 | 2/2010 |
| WO | 2011/056402 A2 | 5/2011 |
| WO | 2011/094760 A2 | 8/2011 |
| WO | 2012/050648 A2 | 4/2012 |
| WO | 2012/054239 A2 | 4/2012 |
| WO | 2012/083135 A1 | 6/2012 |
| WO | 2013/116164 A1 | 8/2013 |
| WO | 2013/116165 A1 | 8/2013 |
| WO | 2013/116793 A2 | 8/2013 |
| WO | 2013/116794 A2 | 8/2013 |
| WO | 2014/149509 A2 | 9/2014 |
| WO | 2014/151122 A1 | 9/2014 |
| WO | 2015/081026 A1 | 6/2015 |

OTHER PUBLICATIONS

European Search Report dated Aug. 9, 2019, issued by the European Patent Office in connection with European Patent Application No. 19171426.0 (9 pages).
Notice of Allowance dated Sep. 23, 2019, issued in connection with U.S. Appl. No. 15/621,458 (10 pages).
Hirschmuller, "Stereo Processing by Semi-Global Matching and Mutual Information," IEEE transactions on Pattern Analysis and Machine Intelligence, vol. 30, 2, Dec. 2007 (14 pages).
Census Transform—<https://en.wikipedia.org/wiki/Census_transform>—webpage last edited on Oct. 24, 2019 (2 pages).
Dynamic Programming—<https://en.wikipedia.org/wiki/Dynamic_programming>—webpage last edited on Feb. 24, 2020 (17 pages).
Delaunay Triangulation—<https://en.wikipedia.org/wiki/Delaunay_triangulation>—webpage last edited on Feb. 13, 2020 (8 pages).
Office Action dated Feb. 27, 2020, issued by the Canadian Intellectual Property Office in connection with Canadian Patent Application No. 2,864,831 (3 pages).
Examination Report dated Mar. 17, 2020, issued by the Australian Patent Office in connection with Australian Patent Application No. 2019200259 (4 pages).
Office Action dated Sep. 15, 2020, issued in connection with U.S. Appl. No. 16/703,644 (19 pages).
Notice of Allowance dated Sep. 9, 2020, issued in connection with U.S. Appl. No. 16/365,847 (13 pages).
Office Action dated Sep. 15, 2020, issued by the Canadian Patent Office in connection with Canadian Patent Application No. 2,920,251 (4 pages).
Office Action dated Nov. 10, 2020, issued in connection with U.S. Appl. No. 16/748,174 (8 pages).
International Search Report of the International Searching Authority dated Jan. 29, 2021, issued in connection with International Application No. PCT/US2020/063004 (3 pages).
Written Opinion of the International Searching Authority dated Jan. 29, 2021, issued in connection with International Application No. PCT/US2020/063004 (7 pages).
Office Action dated Feb. 8, 2021, issued in connection with U.S. Appl. No. 16/709,112 (16 pages).
Notice of Allowance dated Apr. 6, 2021, issued in connection with U.S. Appl. No. 16/703,644 (9 pages).
Office Action dated Apr. 16, 2021, issued by the Canadian Patent Office in connection with Canadian Patent Application No. 2,864,831 (7 pages).
Office Action dated Jul. 6, 2021, issued by the Canadian Patent Office in connection with Canadian Patent Application No. 2,920,251 (3 pages).
Notice of Allowance dated Aug. 4, 2021, issued in connection with U.S. Appl. No. 16/748,174 (8 pages).
Notice of Allowance dated Aug. 19, 2021, issued in connection with U.S. Appl. No. 16/709,112 (5 pages).
Examination Report dated Apr. 4, 2022, issued by the Australian Patent Office in connection with Australian Patent Application No. 2021201579 (4 pages).
Office Action dated Apr. 22, 2022, issued in connection with U.S. Appl. No. 17/403,792 (13 pages).
Pictometry Visual Intelligence, "Pictometry—In the News, Pictometry Announces Software and Web-based Solution for Engineers, Architects, and Planners", 2009 (3 pages).
Pictometry Visual Intelligence, "Frequently Asked Questions", 2005 (6 pages).
Pictometry Visual Intelligence, http://web.archive.org/web/20020725232638/http://www.pictometry.com, 1995-2002 (2 pages).
Porway, et al., "A Hierarchical and Contextual Model for Aerial Image Parsing," 2008 (53 pages).
Poullis, et al., "Photogrammetric Modeling and Image-based Rendering for Rapid Virtual Environment Creation", 1998 (7 pages).
PrecigeoRoof, "Why precigeoRoof", Jan. 7, 2007 (2 pages).
Zheng, et al., "A Consistent Segmentation Approach to Image-based Rendering", Technical Report CSE-09-03-02, 2002 (8 pages).
Preciozzi, "Dense Urban Elevation Models From Stereo Images by an Affine Region Merging Approach," Master's Thesis, Universidad de la Republica, Montevideo, Sep. 18, 2006 (93 pages).
Reddy, et al., "Frequency-Space Decomposition and Acquisition of Light Transport Under Spatially Varying Illumination", EECV 2012 (14 pages).
RoofCAD, "Satellite Takeoff Tutorial—Pitched Roof", 2012 (25 pages).
RoofCAD, "User Guide", True North Estimating Systems, Ltd., 2003 (320 pages).
Rottensteiner, et al., "Automatic Generation of Building Models from Lidar Data and the Integration of Aerial Images," ISPRS, vol. XXXIV, 2003 (7 pages).
Rupnik, et al., "Oblique Multi-Camera Systems—Orientation and Dense Matching Issues", The International Archives of teh Photogrammetry, Remote Sensing and Spatial Information Sciences, vol. XL-3W1, 2014 (8 pages).
San, et al., "Building Extraction from High Resolution Satellite Images Using Hough Transform," International Archives of the Photogrammetry, Remote Sensing and Spatial Information Science, vol. XXXVIII, 2010 (6 pages).
Scholze, et al., "A Probabilistic Approach to Building Roof Reconstruction Using Semantic Labelling", 2002 (8 pages).
Seitz, et al., "A Comparison and Evaluation of Multi-View Stereo Reconstruction Algorithms", CVPR 2006 (8 pages).
Shan, et al., "Refractive Height Fields from Single and Multiple Images", 2012 (8 pages).
"Sorcerer: Nobody builds roofs like this builds roofs", retrieved from URL=http://web.archive.org/web/2006021409237/http://www.applicad.com/au/product-features . . . on Mar. 29, 2012 (2 pages).
Zheng, et al. "Parallax Photography: Creating 3D Cinematic Effects from Stills", 2009 (8 pages).
Syed, et al., "Semi-Automatic 3D Building Model Generation From Lidar and High Resolution Imagery," Proceedings of SSC Spatial Intelligence, Sep. 2005 (8 pages).
"Transcription of points of potential interest in the attached Youtube video titled: Pictometry Online Demo", retrieved on Feb. 10, 2010 (1 page).
Taillandier, et al., "Automatic Building Reconstruction from Aerial Images: A Generic Bayesian Framework", 2004 (6 pages).
Ulm, et al., "3D City Modelling with Cybercity-Modeler", 1st EARSel workshop of the SIG Urban Remote Sensing, Mar. 2-3, 2006 (9 pages).
University of Washington, "College of Arts & Sciences Mathematics: Detailed course offerings . . . ", retrieved from http://www.washington.edu/students/crscat/math.html on Oct. 25, 2013 (16 pages).

(56) References Cited

OTHER PUBLICATIONS

Verma, "3D Building Detection and Modeling from Aerial LIDAR Data," IEEE, 2006 (8 pages).
Vosselman, "Fusion of Laser Scanning Data, Maps, and Aerial Photographs for Building Reconstruction", 2002 (4 pages).
Vosselman, et al. "Map Based Building Reconstruction from Laser Data and Images", 2001 (9 pages).
Vosselman, et al., "Mapping by Dragging and Fitting of Wire-Frame Models", Photogrammetric Engineering and Remote Sensing, Jul. 1999 (8 pages).
Wang, et al., "Pictometry's Proprietary Airborne Digital Imaging System and It's Application In 3D City Modelling", 2008 (6 pages).
Wattenberg, et al., "Area, Volume and Torque in Three Dimensions", retrieved from http://www.math.montana.edu/frankw/ccp/multiworld/twothree/atv/learn.htm on Sep. 24, 2013 (14 pages).
Weeks, et al., "A Real Time, Multichannel System with Parallel Digital Signal Processors", IEEE, 1990 (4 pages).
Werner, et al., "New Techniques for Automated Architectural Reconstruction from Photographs," Department of Engineering Science, University of Oxford, 2002 (15 pages).
Wolf, Elements of Photogrammetry—Chapter 14: Aerotriangulation, 1974 (3 pages).
Wood, et al., "Surface Light Fields for 3D Photography", SIGGRAPH 2000 (10 pages).
Zhang, et al., "Spacetime Stereo: Shape Recovery for Dynamic Scenes", 2003 (8 pages).
Written Opinion of the International Searching Authority dated Nov. 17, 2014, issued in connection with International Application No. PCT/US14/49605 (4 pages).
Wu, et al., "Multicore Bundle Adjustment", 2011 (8 pages).
Wu, et al., "Schematic Surface Reconstruction", 2012 (8 pages).
www.archive.org, "Main Features: Photomodeler is Fully Loaded and Ready to Perform", retrieved from http://www.photomodeler.com/pmpro08.html on Oct. 21, 2013 (4 pages).
Xactware Solutions, Inc., "Xactimate Sketch—Import Underlay Image," 2008 (4 pages).
Xactware, "Roof and Property Insight", 2015 (10 pages).
Xiao, et al., "Geo-spatial Aerial Video Processing for Scene Understanding and Object Tracking," IEEE, 2008 (8 pages).
Ye, et al., "Automated Reconstruction of Urban House Roofs from Aerial Imagery", IEEE 2001 (3 pages).
YouTube, "Pictometry Online Demo", retrieved Feb. 6, 2009 (1 page).
Zhang, et al., "Rapid Shape Acquisition Using Color Structured Light and Multi-pass Dynamic Programming", 2002 (13 pages).
Zhang, et al., "Shape and Motion Under Varying Illumination: Unifying Structure from Motion, Photometric Stereo, and Multi-view Stereo", 2003. (8 pages).
Notice of Allowance dated Nov. 14, 2016, issued in connection with U.S. Appl. No. 14/450,861 (11 pages).
Notice of Allowance dated Jul. 25, 2016, issued in connection with U.S. Appl. No. 14/450,861 (12 pages).
Office Action dated Nov. 5, 2015, issued in connection with U.S. Appl. No. 14/450,861 (14 pages).
European Search Report dated Mar. 14, 2017, issued by the European Patent Office in connection with European Patent Application No. 14832467.6 (6 pages).
Applicad Roofing, sample report, Jul. 30, 2007 (1 page).
Applicad Roofing, sample report, Mar. 2, 2005 (28 pages).
AppliCad USA, "Linear Nesting Reports," AppliCad Sample Reports, Nov. 25, 1999 (10 pages).
Applicad webpage 2005 snip different color lines (1 page).
Applicad, "Example Output and Brochures," retrieved from URL= http://www.applicad.com/auiproduct-reports.html, Apr. 16, 2012 (2 pages).
AppliCad, "Product Overview—Sorcerer: Advanced Software for Roofing Modeling, Estimating, Presentation and nstallation," Issue 5, Mar. 2, 2001 (13 pages).
AppliCad, "Roofing Software: Product Bulletin Section 1—Modeling the Roof," Dec. 20, 2005 (3 pages).
AppliCad, "Roofing Software: Product Bulletin Section 1—Modeling the Roof," Jan. 7, 2002 (3 pages).
AppliCad, "Roofing Software: Product Bulletin Section 2—Modifying the Model," Dec. 20, 2005 (2 pages).
AppliCad, "RoofScape: Advanced Software for Roof Modelling and Estimating," Learning Guide (English Units) Revision 1.1, Aug. 23, 2007 (48 pages).
AppliCad, "Tips and Tricks: Items drawn from AppliCad's Customer Service file", Jul. 27, 2007 (11 pages).
Autodesk, "Autodesk ImageModeler-Features", http://usa.autodesk.com/adsk/servlet/index?siteID=123112&id=115639 . . . , 2008 (1 page).
Automatic House Reconstruction, retrieved on Sep. 29, 2008, from http://www.vision.ee.ethz.ch/projects/Amobe_I/recons.html (6 pages).
Avrahami, et al., "Extraction of 3D Spatial Polygons Based on the Overlapping Criterion for Roof Extraction from Aerial Images", International Archives of Photogrammetry, Remote Sensing & Spatial Information Sciences, Aug. 29-30, 2005 (6 pages).
Azuma, et al., "View-dependent Refinement of Multiresolution Meshes with Subdivision Connectivity", Feb. 2003 (9 pages).
"8 Epipolar Geometry and the Fundamental Matrix", retrieved Oct. 25, 2013 (25 pages).
Baillard, et al., "3-D Reconstruction of Urban Scenes from Aerial Stereo Imagery: A Focusing Strategy," Computer Vision and Image Understanding, vol. 76, No. 3 pp. 244-258, Dec. 1999 (15 pages).
Baillard, et al., "Automatic Reconstruction of Piecewise Planar Models from Multiple Views", 1999 (7 pages).
Bazaraa, et al., "Nonlinear Programming Theory and Algorithms", Second Edition, John Wiley & Sons, Inc., New York, 1993 (646 pages).
Behley, et al., "Generation of 3D City Models using Domain-Specific Information Fusion", Institute of Computer Science III, 2009 (10 pages).
Bernhardsen, "Geographic Information Systems, An Introduction," 2nd Ed., 1999 (4 pages).
Bertan, et al., "Automatic 3D Roof Reconstruction Using Digital Cadastral Map, Architectural Knowledge and an Aerial Image," 2006 (4 pages).
Bhat, et al., "A Perceptually-Motivated Optimization-Framework for Image and Video Processing", 2008 (10 pages).
Bhat, et al., "Fourier Analysis of the 2D Screened Poisson Equation for Gradient Domain Problems", ECCV 2008 (14 pages).
Bhat, et al., "GradientShop: A Gradient-Domain Optimization Framework for Image and Video Filtering", 2010 (14 pages).
Bhat, et al., "Piecewise Image Registration in the Presence of Multiple Large Motions", Jun. 2006 (7 pages).
Bhat, et al., "Using Photographs to Enhance Videos of a Static Scene", Eurographics Symposium on Rendering, 2007 (12 pages).
Bignone, et al., "Automatic Extraction of Generic House Roofs from High Resolution Aerial Imagery", 1996 (12 pages).
Brofferio, et al., "Interactive Detection of 3D Models of Building's Roofing for the Estimation of the Solar Energy Potential," Sep. 4-8, 2006 (5 pages).
Burrough, et al., "Principles of Geographical Information Systems", Spatial Information Systems and Geostatistics, 1998 (14 pages).
Capell, et al., "A Multiresolution Framework for Dynamic Deformations", SIGGRAPH 2002 (8 pages).
Chen, et al., "Building Reconstruction from LIDAR Data and Aerial Imagery", IEEE 2005 (4 pages).
Chen, et al., "Fusion of LIDAR Data and Optical Imagery for Building Modeling", 2004 (6 pages).
Chen, et al., "Reconstruction of Building Models with Curvilinear Boundaries from Laser Scanner and Aerial Imagery", 2006 (10 pages).
Chevrier, et al., "Interactive 3D Reconstruction for Urban Areas: An image based tool", 2001 (13 pages).
Chikomo, et al., "An Integrated Approach to Level-of-Detail Building Extraction and Modelling Using Airborne LIDAR and Optical Imagery", Sep. 19-21, 2007 (6 pages).
Chuang, et al., "A Bayesian Approach to Digital Matting", IEEE 2001 (8 pages).
Chuang, et al., "Animating Pictures with Stochastic Motion Textures", SIGGRAPH, 2005 (8 pages).

(56) References Cited

OTHER PUBLICATIONS

Chuang, et al., "Animating Pictures with Stochastic Motion Textures", Technical Report UW-CSE-04-04-02, 2005 (7 pages).
Chuang, et al., "Environment Matting Extensions: Towards Higher Accuracy and Real-Time Capture", SIGGRAPH 2000 (10 pages).
Chuang, et al., "Shadow Matting and Compositing", SIGGRAPH 2003 (7 pages).
Clarke, "Getting Started with Geographic Information Systems," Geographic Information Science, 2nd Ed., 1999 (7 pages).
Colburn, et al., "Image-Based Remodeling", IEEE Transactions on Visualization and Computer Graphics, vol. 19, No. 1, 2012 (13 pages).
Collins, et al., "Automatic Extraction of Buildings and Terrain from Aerial Images", Department of Computer Science, University of Massachusetts, 1995 (10 pages).
Collins, et al., "UMass Progress in 3D Building Model Acquisition", 1996 (11 pages).
Notice of Allowance dated May 20, 2016, issued in connection with U.S. Appl. No. 13/397,325 (7 pages).
Notice of Allowance dated Sep. 20, 2016, issued in connection with U.S. Appl. No. 13/397,325 (5 pages).
Cord, et al., "Bayesian Model Identification: Application to Building Reconstruction in Aerial Imagery", IEEE 1999 (5 pages).
Croitoru, et al., "Right-Angle Reooftop Polygon Extraction in Regularised Urban Areas: Cutting the Corners," Technion-Israel Institute of Technology, Dec. 2004 (31 pages).
Curless, "From Range Scans to 3D Models" SIGGRAPH Computer Graphics, 1999 (8 pages).
Jaynes, et al., "Recognition and Reconstruction of Buildings from Multiple Aerial Images," Oct. 18, 2001 (37 pages).
Johnson, et al., Surface Matching for Object Recognition in Complex 3-D Scenes, 1998 (31 pages).
Khoshelham, et al., "A Model-Based Approach to Semi-Automated Reconstruction of Buildings from Aerial Images", The Photogrammetric Record, Dec. 2004 (18 pages).
Kolbl, et al., "Chapter 2: Scanning and State-of-the-Art Scanners". Digital Photogrammetry: An Addendum to the Manual of Photogrammetry, 1996 (37 pages).
Kolman, "Elementary Linear Algebra: Chapter 4, Linear Transformations and Matrices", Second Edition, Macmillan Publishing Co., 1997 (12 pages).
Korte, "The GIS Book: Understanding the Value and Implementation of Geographic Information Systems", 4th Ed., 1997 (14 pages).
Krainin, et al., "Autonomous Generation of Complete 3D Object Models Using Next Best View Manipulation Planning", CRA 2011 (7 pages).
Kushal, et al., "Photo Tours", 3DimPVT, Oct. 2012 (8 pages).
Labe, et al., "Robust Techniques for Estimating Parameters of 3D Building Primitives", International Society for Photogrammetry and Remote Sensing, vol. XXXII, Part 2, Commission II, Proceedings of the Commission II Symposium, Data Integration: Systems and Techniques, Jul. 13-17, 1998 (11 pages).
Lee, et al., "Fusion of Lidar and Imagery for Reliable Building Extraction", Photogrammetric Engineering and Remote Sensing, Feb. 2008 (11 pages).
Levoy, "The Digital Michelangelo Project", retrieved from http://www-graphics.stanford.edu/projects/mich/ on Oct. 25, 2013 (10 pages).
Levoy, et al., "The Digital Michelangelo Project: 3D Scanning of Large Statues", 2000 (14 pages).
LexisNexis, "Software; New Products", Roofing Contractor, Jan. 3, 2006 (1 page).
Li, et al., "Automated Generation of Interactive 3D Exploded View Diagrams" SIGGRAPH 2007 (7 pages).
Li, et al., "Interactive Cutaway Illustrations of Complex 3D Models", ACM Transactions on Graphics 26(3), SIGGRAPHY, 2007 (11 pages).
Liu, et al., "Building Extraction from High Resolution Satellite Imagery Based on Multi-scale Image Segmentation and Model Matching", IEEE 2008 (7 pages).
Lu, et al., "Automatic Building Detection Using the Dempster-Shafer Algorithm," Photogrammetric Engineering & Remote Sensing, vol. 72, No. 4, Apr. 2006 (9 pages).
Ziegler, et al., "3D Reconstruction Using Labeled Image Regions", 2003 (12 pages).
Lu, et al., "Stereo Image Matching Using Robust Estimation and Image Analysis Techniques for Dem Generation," International Archives of Photogrammetry and Remote Sensing, vol. XXXIII, Part B3, Amsterdam 2000 (8 pages).
Lueders, "Infringement Allegations by Eagleview Technologies", Feb. 10, 2009 (3 pages).
Mahajan, et al., "A Theory of Frequency Domain Invariants: Spherical Harmonic Identities for BRDF/Lighting Transfer and Image Consistency", IEEE Transactions on Pattern Analysis and Machine Intelligence, vol. 30, No. 2, Feb. 2008 (14 pages).
Mahajan, et al., "A Theory of Spherical Harmonic Identities for BRDF/Lighting Transfer and Image Consistency", ECCV 2006 (15 pages).
Maini, et al., "Study and Comparison of Various Image Edge Detection Techniques", International Journal of Image Processing, vol. 3: Issue 1, 2009 (12 pages).
Mann, "Roof with a view", Contract Journal, Nov. 23, 2005 (2 pages).
Maune, Chapter 6: DEM Extraction, Editing, Matching and Quality Control Techniques. Digital Photogrammetry: An Addendum to the Manual of Photogrammetry, 1996 (27 pages).
McGlone, "Chapters: Aerial Triangulation Adjustment and Image Registration," Digital Photogrammetry: An Addendum to the Manual of Photogrammetry, 1996 (25 pages).
McGlone, "Sensor Modeling in Image Registration, Chapter 5:Aerial Triangulation Adjustment and Image Registration", 1996 (9 pages).
McGlone, et al., "Projective and Object Space Geometry for Monocular Building Extraction," School of Computer Science, Carnegie Mellon University, Jun. 20-23, 1994 (31 pages).
McKeown, Jr., et al., "Chapter 9: Feature Extraction and Object Recognition, Automatic Cartographic Feature Extraction Using Photogrammetric Principles". Digital Photogrammetry: An Addendum to the Manual of Photogrammetry, 1996 (19 pages).
Meixner, et al., 3-Dimensional Building Details from Aerial Photography for Internet Maps, Institute for Computer Graphics and Vision, Apr. 8, 2011 (27 pages).
Mikhail, et al., "Introduction to Modern Photogrammetry", John Wiley&Sons, Inc., New York, 2001 (487 pages).
Mikuni, "Chapter 7: Digital Orthophotos: Production, Mosaicking, and Hardcopy". Digital Photogrammetry: An Addendum to the Manual of Photogrammetry, 1996 (11 pages).
Miller, "Pictometry in Arlington Virginia:Software gives small Arlington the big picture", Dec. 2001 (2 pages).
Miller, et al., "Miller's Guide to Framing and Roofing", McGraw Hill, New York, 2005 (9 pages).
Minialoff, "Introduction to Computer Aided Design", Apr. 2000 (4 pages).
Moons, et al., "Automatic Modelling and 3D Reconstruction of Urban House Roofs from High Resolution Aerial Imagery", 2006 (16 pages).
Mortensen, et al., "Intelligent Scissors for Image Composition", Brigham Young University, 1995 (8 pages).
Mostafa, et al., "A Multi-Sensor System for Airborne Image Capture and Georeferencing," Photogrammetric Engineering & Remote Sensing, vol. 66, No. 12, Dec. 2000 (7 pages).
Nizar, et al., "Reconstruction of Buildings from Airborne Laser Scanning Data", 2006 (10 pages).
Noronha, et al., "Detection and Modeling of Buildings from Multiple Aerial Images". IEEE Transactions on Pattern Analysis and Machine Intelligence, vol. 23, No. 5, May 2001 (32 pages).
Ortner, et al., "Building Extraction from Digital Elevation Model", INRIA, Jul. 2002 (51 pages).
Pedant, et al., "Scene Registration in Aerial Image Analysis". Digital Mapping Laboratory, School of Computer Science, Carnegie Mellon University, Pittsburg PA, 1990 (13 pages).
Photogrammetric Engineering and Remote Sensing, "PE&RS, Journal of the American Society for Photogrammetry and Remote Sensing", vol. 68, No. 9, Sep. 2002 (2 pages).

(56) References Cited

OTHER PUBLICATIONS

PhotoModeler Pro 4.0—The New Release, "The Premier Software for Measuring and Modeling the Real-World is even better!," 1995-2000 (35 pages).
Photomodeler.com, "PhotoModeler Pro 5: Measuring and Modeling the Real World", 2003 (2 pages).
"Pictometry Aerial Images and Electronic Field Study Software", 2008 (2 pages).
Pictometry Intelligent Images, EFS Version 2.7 Release Notes, 2007 (30 pages).
Pictometry International Corp., "Electronic Field Study User Guide". Version 2.7, Jul. 2007 (536 pages).
Pictometry Online, "Government", Oct. 7, 2008 (3 pages).
Pictometry search results, researched on Sep. 23, 2013 (21 pages).
Applicad, "Product Bulletin—Nov. 2002: Key Features of Our Roofing Software," Nov. 2002 (46 pages).
"3D Reconstruction", retrieved Oct. 25, 2013 (5 pages).
Bhanu, et al. "Adaptive Integrated Image Segmentation and Object Recognition; IEEE Trans. Systems, Man, and Cybernetics—Part C" Applications and Reviews, vol. 30, No. 4, Nov. 2000; 427-441 (15 pages).
Choi, et al. "Vehicle Detection from Aerial Images Using Local Shape Information" PSIVT 2009, LNCS 5414; Springer-Verlag Berlin Heidelberg; 2009; pp. 227-236 (10 pages).
Collins, et al., "Site Model Acquisition and Extension from Aerial Images" ICCV '95 Proc. 5th Int. Conf. Computer Vision; 1995; pp. 1-6 (6 pages).
Kaufhold, et al., "Recognition and Segmentation of Scene Content Using Region-Based Classification" Proceedings of the 18th International Converence on Pattern Recognition (ICPR'06); 2006; pp. 1-6 (6 pages).
Moscatelli, et al., "Advanced Topics in Artificial Intelligence" Lecture Notes in Computer Science vol. 617, 1992, pp. 161-197 (37 pages).
Nobel, et al., "Histogram Classification Using Vector Quantization" Proc. IEEE Int. Symp. Information Theory; 1994; p. 391 (1 page).
Shafer, et al., "Recursive Region Segmentation by Analysis of Histograms" Proc. IEEE Int. Conf. Acoustics, Speech, Signal Processing, 1982, pp. 1166-1171 (6 pages).
Stilla, et al., "Reconstruction of Building Models from Maps and Laser Altimeter Data" Agouris and Stefanidis (Eds.): ISD'99, LNCS1737, pp. 34-46, 1999 (13 pages).
Ahonen, et al., "Rotation Invariant Image Description with Local Binary Pattern Histogram Fourier Features" in Text: Image Analysis, SCIA 2009 Proceedings, Lecture Notes in Computer Science 5575, 2009; pp. 61-70 (10 pages).
"Xactimate 27—Aerial Sketch," Internet printout from http://www.xactware.com/solutions/claims-estimating/27-3/aerial-sketch, 2012 (3 pages).
International Search Report of the International Searching Authority dated Apr. 26, 2013, issued in connection with International Application No. PCT/US2013/26385 (2 pages).
Written Opinion dated Apr. 26, 2013, issued in connection with International Application No. PCT/US2013/26385 (4 pages).
Notice of Allowance dated Jan. 14, 2016, issued in connection with U.S. Appl. No. 13/397,325 (5 pages).
Office Action dated Oct. 21, 2014, issued in connection with U.S. Appl. No. 13/397,325 (36 pages).
Office Action dated Mar. 12, 2014, issued in connection with U.S. Appl. No. 13/397,325 (31 pages).
Office Action dated Jun. 16, 2015, issued in connection with U.S. Appl. No. 13/397,325 (16 pages).
Office Action dated Oct. 9, 2018, issued by the Canadian Intellectual Property Office issued in connection with Canadian Patent Application No. 2,864,831 (6 pages).
Office Action dated Mar. 4, 2019, issued in connection with U.S. Appl. No. 15/358,870 (7 pages).
Notice of Allowance dated Jul. 23, 2019, issued in connection with U.S. Appl. No. 15/358,870 (8 pages.

Gehrke, et al., "Semi-Global Matching: An Alternative to Lidar for DSM Generation?" published 2010 (6 pages).
A History of Roof Modelling Using Aerial Imagery, Sep. 1983 (4 pages).
Able Software Corp., "R2V User's Manual, Advanced Raster to Vector Conversion Software". Publicly available Sep. 16, 2000 (167 pages).
AeroDach Web Site http://www.aerodach.de from Jun. 13, 2004 (retrieved Sep. 20, 2012) and translations to English (21 pages).
Aerodach, "Protokoll zur Dachauswertung", Oct. 19, 2010 (12 pages).
Aerowest GmbH Logo, "Aerodach Online Roof Analysis: Standard Delivery Format and 3D Dataset", 2002 (6 pages).
Aerowest GmbH, "AeroDach-das patentierte Dachaufmass", retrieved from URL=http://web.archive.org/web/20060101021543/http://www.aerowest.de/aerodach.html, 2006 (2 pages).
Aerowest GmbH, "Aerowest Pricelist of Geodata", AeroDach Online, Aeroview, Oct. 21, 2005 (2 pages).
Aerowest GmbH, "Geodata Service; AeroDach-Patented Roof Dimensions", 2006 (2 pages).
Aerowest GmbH, "Preisliste Geodaten Aerowest", Oct. 21, 2005 (1 page).
Aerowest GMBH, AeroDach Online Dachauswertung: Standardlieferformat und 3D-Datensatz, 2002 (6 pages).
Aerowest GmbH, AeroDach Online, Geodatenservice, 2005 (18 pages).
Aerowest Web Site http://aerowest.de/ from Feb. 6, 2006 (retrieved Sep. 20, 2012) and translated to English (61 pages).
Agarwal, et al., "Building Rome in a Day", Communications of the ACM, vol. 54, No. 10, Oct. 2011 (8 pages).
Agarwal, et al., "Reconstructing Rome", IEEE Computer Society, 2010 (8 pages).
Agarwala, et al., "Interactive Digital Photomontage", SIGGRAPH 2004 (9 pages).
Agarwala, et al., "Panoramic Video Textures", ACM SIGGRAPH 2005 (7 pages).
Ameri, et al., "Automatic 3D Building Reconstruction Using Plane-Roof Structures", Institute for Photogrammetry, University of Stuttgart, 2000 (12 pages).
American Congress on Surveying and Mapping, "Definitions and Surveying and Associated Terms", 1989 (2 pages).
American Society of Civil Engineering, "Glossary of the Mapping Sciences" ASCE Publications, 1994 (3 pages).
Appli-cad Australia, "Linear Nesting Reports," AppliCad Australia, UK Sample Reports, Jul. 18, 2000 (9 pages).
Appli-cad Australia, "Roof Magician: Especially Suited to Shingle, Shake and Tile Roofing," Sample Reports, Jun. 24, 2004 (13 pages).
Appli-cad Australia, "Roof Wizard: Advanced Software for Roof Modeling and Estimating," Sep. 25, 2004 (10 pages).
Appli-cad Australia, "Roof Wizard: Especially Suited to Metal Roofing", Mar. 9, 2005 (7 pages).
Appli-cad Australia, "Roof Wizard: Especially Suited to Metal Roofing," Jul. 13, 2004 (24 pages).
Appli-cad Australia, "Roof Wizard: Especially Suited to Metal Roofing," Sep. 14, 2006 (7 pages).
Appli-cad Australia, "Roof Wizard: Especially Suited to Metal Roofing," Sep. 17, 2002 (12 pages).
Appli-cad Australia, "Sorcerer: Advanced Software for Roof Modeling and Estimating," Reference Guide V. 3, Sep. 8, 1999 (142 pages).
Appli-cad Australia, "Sorcerer: The Complete Solution for Professional Roof Estimating," Demonstration Kit, Mar. 9, 2005 (15 pages).
Curless et al., "New Methods for Surface Reconstruction from Range Images", Dissertation, submitted to the Department of Electrical Engineering and the Committee of Graduate Studies of Stanford University, Jun. 1997 (209 pages).
Curless, et al., "A Volumetric Method for Building Complex Models from Range Images", 1996 (10 pages).
Curless, et al., "Better Optical Triangulation through Spacetime Analysis", 1995 (8 pages).
Curless, et al., "Computer model and 3D fax of Happy Buddha", retrieved Oct. 25, 2013 (4 pages).

(56) References Cited

OTHER PUBLICATIONS

Debevec, et al., "Modeling and Rendering Architecture from Photographs: A hybrid geometry- and image-based approach," University of California at Berkeley, 1996 (10 pages).
Delaney, "Searching for Clients from Above—More Small Businesspeople Use Aerial mapping Services to Scout Potential Customers", The Wall Street Journal, Jul. 31, 2007 (4 pages).
Directions Magazine, "Microsoft MSN Virtual Earth: The Map is the Search Platform", 2009 (10 pages).
*Eagle View Tech v. Aerialogics LLC*, "Prior Art Presentation", Case No. 2:12-cv-00618-RAJ, Aug. 17, 2012 (61 pages).
Eagle View Technologies and Applicad Software, "AppliCad Software and EagleView Technologies Partner for Metal Roofing Contractors", EagleView Blog, Feb. 4, 2011 (2 pages).
ECE 390 Introduction to Optimization, Spring 2004, retrieved Oct. 25, 2013 (1 page).
Elaksher, et al., "Roof Boundary Extraction Using Multiple Images", Photogrammetric Record, Mar. 2003 (14 pages).
Elbernick, et al., "Adding the Third Dimension to a Topographic Database Using Airborne Laser Scanner Data", 2006 (6 pages).
Falkner, et al., "Aerial Mapping: Methods and Applications—Chapter 11: Aerotriangulation" Second Edition, 2002 (23 pages).
Faugeras, "What Can Be Seen in Three Dimensions with an Uncalibrated Stereo Rig?", 1992 (16 pages).
Faugeras, et al., "3-D Reconstruction of Urban Scenes from Sequences of Images", Institut National De Recherche En Informatique Et En Automatique, 1995 (26 pages).
Federal Register, "Notices", Geological Survey, vol. 64, No. 18, Jan. 28, 1999 (1 page).
Fisher, et al., "Dictionary of Computer Vision and Image Processing", John Wiley&Sons, 2005 (337 pages).
Flamanc, et al., "3D City Models: An Operational Approach Using Aerial Images and Cadastral Maps", Sep. 17-19, 2003 (6 pages).
Fritsch, "Introduction into Digital Aerotriangulation" Photogrammetric Week, Wichmann Verlag, Heidelberg, 1995 (7 pages).
Fritsch, et al., "Oblique Image Data Processing—Potential, Experiences and Recommendations", Photogrammetric Week, Wichmann/VDE Verlag, Berlin and Offenbach, 2013 (16 pages).
Furukawa, et al., "Manhattan-world Stereo", 2009 (8 pages).
Furukawa, et al., "Reconstructing Building Interiors from Images", 2009 (8 pages).
Furukawa, et al., "Towards Internet-scale Multi-view Stereo", 2010 (8 pages).
Georgeiv, et al., "Spatio-Angular Resolution Tradeoff in Integral Photography" Eurographics Symposium on Rendering, 2006 (10 pages).
Geospan Corporation, "Digital Geo-Referenced Oblique Aerial Imagery Solution EPP-RFP No. 8444 5/13", 2007 (28 pages).
Getting to Know ArcView GIS: the geographic information system (GIS) for everyone, "Discover the world of desktop mapping and GIS," 1996-1998 (4 pages).
Gleicher, et al., "Image Snapping", Advanced Technology Group, Apple Computer, Inc., 1995 (8 pages).
Goesele, et al., "Multi-View Stereo for Community Photo Collections", Proceedings of ICCV, 2007 (8 pages).
Goesele, et al., "Multi-View Stereo Revisited", 2006 (8 pages).
Goldman, et al., "Interactive Video Object Annotation", Technical Report UW-CSE-2007-04-01, 2007 (7 pages).
Gomes, et al., "A Photogrammetric Project in Brazil: the Use of the PhotoModeler Software," 1999 (8 pages).
Gong, et al., "3D Model-Based Tree Measurement from High-Resolution Aerial Imagery", Photogrammetric Engineering and Remote Sensing, Nov. 2002 (10 pages).
Gonzalez, et al., "Digital Image Processing", Addison-Wesley Publishing Company, Inc., 1993 (735 pages).
Gulch, et al., "On the Performance of Semi-Automatic Building Extraction", In the International Archives of Photogrammetry and Remote Sensing, vol. 23, 1998 (8 pages).
Gulch, et al., "On the Performance of Semi-Automatic Building Extraction," Commission III, Working Group 4, 1998 (8 pages).
Hartley, "In Defense of the Eight-Point Algorithm", IEEE Transactions on Pattern Analysis and Machine Intelligence, vol. 19, No. 6, Jun. 6, 1997 (14 pages).
Hartley, et al., "Invariant and Calibration-Free Methods in Scene Reconstruction and Object Recognition", Final Technical Report, Feb. 28, 1997 (266 pages).
Hartley, et al., "Multiple View Geometry in Computer Vision", Second Edition, Cambridge University Press, 2003 (672 pages).
Hartley, et al., "Multiple View Geometry in Computer Vision: 2.4 A Hierarchy of Transformations", Cambridge University Press, 2003 (9 pages).
Hartley, et al., "Multiple View Geometry in computer vision: Appendix 6—Iterative Estimation Methods", Cambridge University Press, Second Edition, 2003 (34 pages).
Henricsson, et al., "3-D Building Reconstruction with Aruba: A Qualitative and Quantitative Evaluation", Institute of Geodesy and Photogrammetry, 2001 (12 pages).
Higgins, "A Computer Algorithm for Reconstructing a Scene from Two Projections", Macmillan Journals Ltd article, vol. 293, Sep. 10, 1981 (3 pages).
Hill, "Pictometry: Aerial Photography on Steroids", www.lawenforcement.com, Jul. 2002 (3 pages).
Hsieh, "Design and Evaluation of a Semi-Automated Site Modeling System", Carnegie Mellon, Nov. 1995 (83 pages).
Hsieh, "SiteCity: A Semi-Automated Site Modelling System", IEEE, 1996 (8 pages).
Hu, et al., "Building Modeling From LIDAR and Aerial Imagery", 2004 (8 pages).
Hudson, "Appendix D: Merging VRML Models Extending the Use of Photomodeller", University of Virginia, Mar. 23, 1998 (23 pages).
Zongker, et al., "Environment Matting and Compositing", 1999 (10 pages).
International Search Report of the International Searching Authority dated Nov. 17, 2014, issued in connection with International Application No. PCT/US14/49605 (3 pages).
Jaw, et al., "Building Roof Reconstruction by Fusing Laser Range data and Aerial Images", The International Archives of the Photogrammetry, Remote Sensing and Spatial Information Sciences. vol. XXXVII. Part B3b. 2008 (6 pages).
Communication Pursuant to Article 94(3) EPC dated Nov. 15, 2022, issued by the European Patent Office in connection with European Patent Application No. 19171426.0 (11 pages).
Office Action dated May 9, 2022, issued by the Canadian Intellectual Property Office in connection with Canadian Patent Application No. 2,864,831 (3 pages).
Office Action dated Dec. 1, 2022, issued in connection with U.S. Appl. No. 17/403,792 (28 pages).
Office Action dated Mar. 6, 2023, issued in connection with U.S. Appl. No. 17/499,308 (11 pages).
Office Action dated Feb. 15, 2023, issued by the Canadian Intellectual Property Office in connection with Canadian Patent Application No. 2,864,831 (3 pages).
Examination Report No. 2 dated Mar. 23, 2023, issued by the Australian Patent Office in connection with Australian Patent Application No. 2021201579 (3 pages).
Office Action dated Mar. 15, 2023, issued by the Columbian Patent Office, along with an English translation, in connection with Columbian Patent Application No. NC2022/0008984 (61 pages).
Office Action dated Jun. 8, 2023, issued in connection with U.S. Appl. No. 17/403,792 (27 pages).

* cited by examiner

SYSTEM AND METHOD FOR CONSTRUCTION ESTIMATION USING AERIAL IMAGES

CROSS-REFERENCE TO RELATED APPLICATIONS

This application is a continuation of, and claims the benefit of priority to, U.S. patent application Ser. No. 16/709,112 filed on Dec. 10, 2019, which is a continuation of U.S. patent application Ser. No. 15/358,870 filed on Nov. 22, 2016, now U.S. Pat. No. 10,503,842, issued on Dec. 10, 2019, which is a continuation of U.S. patent application Ser. No. 13/397,325 filed on Feb. 15, 2012, now U.S. Pat. No. 9,501,700, issued on Nov. 22, 2016, the entire disclosures of which are expressly incorporated herein by reference.

BACKGROUND OF THE INVENTION

Field of the Invention

The present invention relates generally to the field of construction estimation. More specifically, the present invention relates to a system and method for construction estimation using aerial images.

Related Art

In the construction and insurance industries, accurate and rapid estimation of construction materials and costs is important. For example, such information is often used by construction professionals to specify materials and associated costs for both newly-constructed buildings, as well as for replacing and upgrading existing structures. Further, in the insurance industry, accurate information about construction materials and costs is critical to determining the proper costs for insuring buildings/structures.

It is of particular importance in the construction and insurance industries to quickly and accurately estimate various parameters regarding roof structures, such as roof dimensions, pitches, surfaces, areas, and associated material costs. To this end, various software systems have been implemented to estimate roofing materials and roofing costs. Such systems process aerial images (e.g., using digital photographs taken from airplanes flying over buildings) and allow users to estimate construction materials and costs by delineating the bounds of a roof, and by calculating dimensions based upon the delineated bounds. However, such systems are time-consuming and difficult to use. Indeed, such systems often require a large amount of manual input by the user (e.g., by manually delineating roof boundaries using a mouse and graphical user interface) before a roof model or estimation report can be generated.

In view of existing technology in this field, what would be desirable is a system that processes aerial images of a building structure and automatically performs steps to quickly and efficiently assist a user in the roof estimation process. Specifically, what would be desirable is a system that automatically delineates roof boundaries in an image of a building or a structure with minimal user intervention, automatically creates a model of the roof structure, and automatically generates a roof estimation report which includes useful information about the roof including material costs and dimensions of the roof. Accordingly, what would be desirable, but has not yet been provided, is a system and method for construction estimation using aerial images which addresses the foregoing needs.

SUMMARY OF THE INVENTION

The present invention relates to a system and method for construction estimation using aerial images. The system includes a computer system for receiving at least one aerial image of a building, and an estimation engine for processing the aerial image to estimate one or more features relating to a roof of the building, the estimation engine histogram processing the aerial image at a plurality of angles to automatically identify a plurality of lines in the image corresponding to features of a roof the building.

A method for building estimation is also provided. The method comprises the steps of receiving at a computer system at least one aerial image of a building, histogram processing the aerial image at a plurality of angles using an estimation engine in the computer system to automatically identify a plurality of lines in the image corresponding to a plurality of feature of a roof of the building, constructing a three-dimensional wireframe model of the roof using the plurality of lines, and processing the three-dimensional model of the roof using the estimation engine to generate a report including information about the roof of the building.

A non-transitory, computer-readable medium is also provided. The computer readable medium includes computer-readable instructions stored thereon which, when executed by a computer system, cause the computer system to perform the steps comprising receiving at a computer system at least one aerial image of a building, histogram processing the aerial image at a plurality of angles using an estimation engine in the computer system to automatically identify a plurality of lines in the image corresponding to a plurality of feature of a roof of the building, constructing a three-dimensional wireframe model of the roof using the plurality of lines, and processing the three-dimensional model of the roof using the estimation engine to generate a report including information about the roof of the building.

BRIEF DESCRIPTION OF THE DRAWINGS

The foregoing features of the invention will be apparent from the following Detailed Description of the Invention, taken in connection with the accompanying drawings, in which.

DETAILED DESCRIPTION OF THE INVENTION

The present invention relates to a system and method for construction estimation using aerial images, as discussed in detail below in connection with FIGS. 1-6K.

Figure 1:
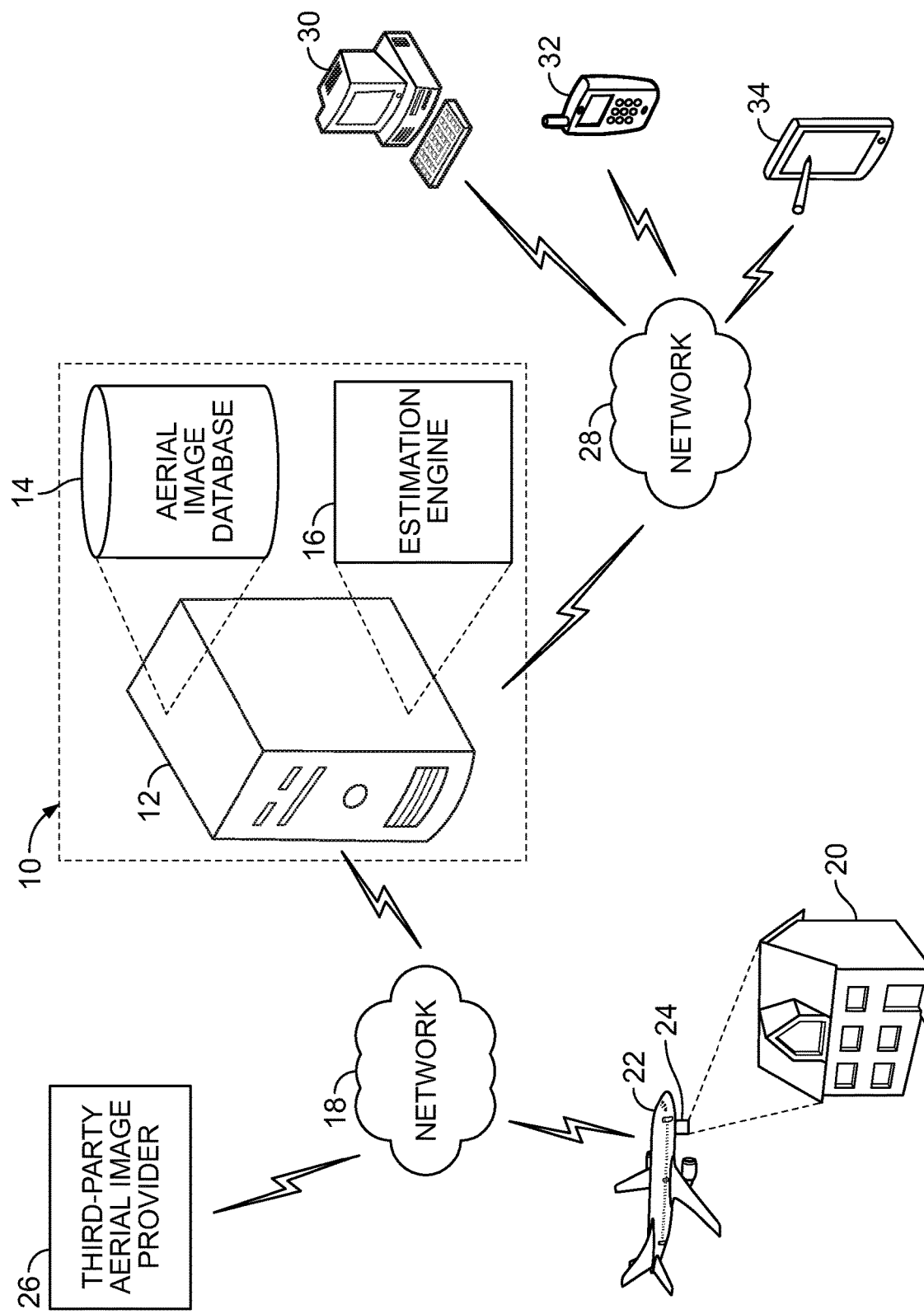
FIG. 1 is a diagram showing the system of the present invention for construction estimation using aerial images.

FIG. 1 is a diagram showing the system of the present invention, indicated generally at 10. The system 10 comprises a computer system 12 (e.g., a server) having an aerial image database 14 stored therein and an estimation software engine (module) 16. The database 14 could be stored on the computer system 12, or located externally (e.g., in a separate database server in communication with the system 10). As will be discussed in greater detail below, the estimation engine 16 allows users to generate three-dimensional models of roofs and buildings/structures to estimate dimensions of such structures as well as material costs and other parameters. Importantly, the estimation engine 16 allows users to easily generate such models by automatically delineating various roof structures such as eaves, hips, ridges, valleys, etc.

The system 10 can communicate through a network 18 with one or more of a variety of image providers to obtain aerial images or photographs of a building structure 20 and can store them in the aerial image database 14 in any suitable format, such as JPEG, TIFF, GIF, etc. Network communication could be over the Internet using standard TCP/IP communications protocols (e.g., hypertext transfer protocol (HTTP), secure HTTP (HTTPS), file transfer protocol (FTP), electronic data interchange (EDI), etc.), through a private network connection (e.g., wide-area network (WAN) connection, e-mails, electronic data interchange (EDI) messages, extensible markup language (XML) messages, file transfer protocol (FTP) file transfers, etc.), or any other suitable wired or wireless electronic communications format.

Image providers that the computer system 12 could communicate with include, but are not limited to, an airplane 22 having a camera 24 capable of capturing images of the structure 20, and/or a third-party aerial image provider 26, such as Pictometry, Google, or Bing. Although images of any quality can be used, high-quality images free from obstructions (e.g., trees, shadows, snow, etc.) are preferred.

The computer system 12 could be any suitable computer server (e.g., a server with an INTEL microprocessor, multiple processors, multiple processing cores) running any suitable operating system (e.g., Windows by Microsoft, Linux, etc.). The computer system 12 includes non-volatile storage, which could include disk (e.g., hard disk), flash memory, read-only memory (ROM), erasable, programmable ROM (EPROM), electrically-erasable, programmable ROM (EEPROM), or any other type of non-volatile memory. The estimation engine 16, discussed in greater detail below, could be embodied as computer-readable instructions stored in computer-readable media (e.g., the non-volatile memory mentioned above), and programmed in any suitable programming language (e.g., C, C++, Java, etc.).

The system 10 could be web-based and could allow for remote access to the system 10 over a network 28 (e.g., Internet, WAN, LAN, etc.) by one or more devices, such as a personal computer system 30, a smart cellular telephone 32, a tablet computer 34, or other devices. It is also contemplated that at least some of the functionality of the system 10 could run locally on devices (e.g., personal computer 30, smart cellular telephone 32, tablet computer 34, etc.) programmed with software in accordance with the present invention. It is conceivable that, in such circumstances, the device could communicate with a remote aerial image database over a network 28.

Figure 2:
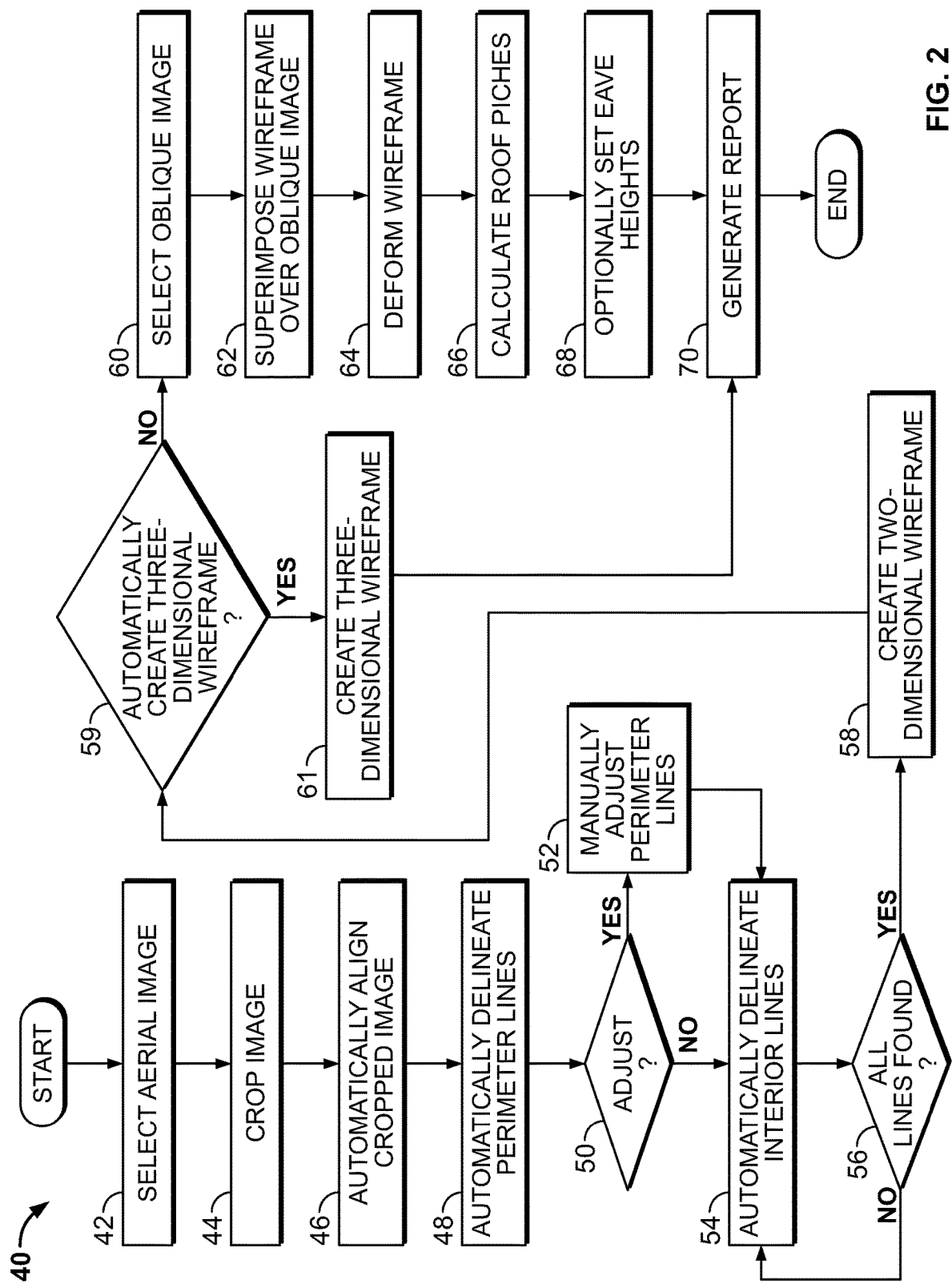
FIG. 2 is a flowchart showing overall processing steps carried out by the system of the present invention.
Figure 3A:
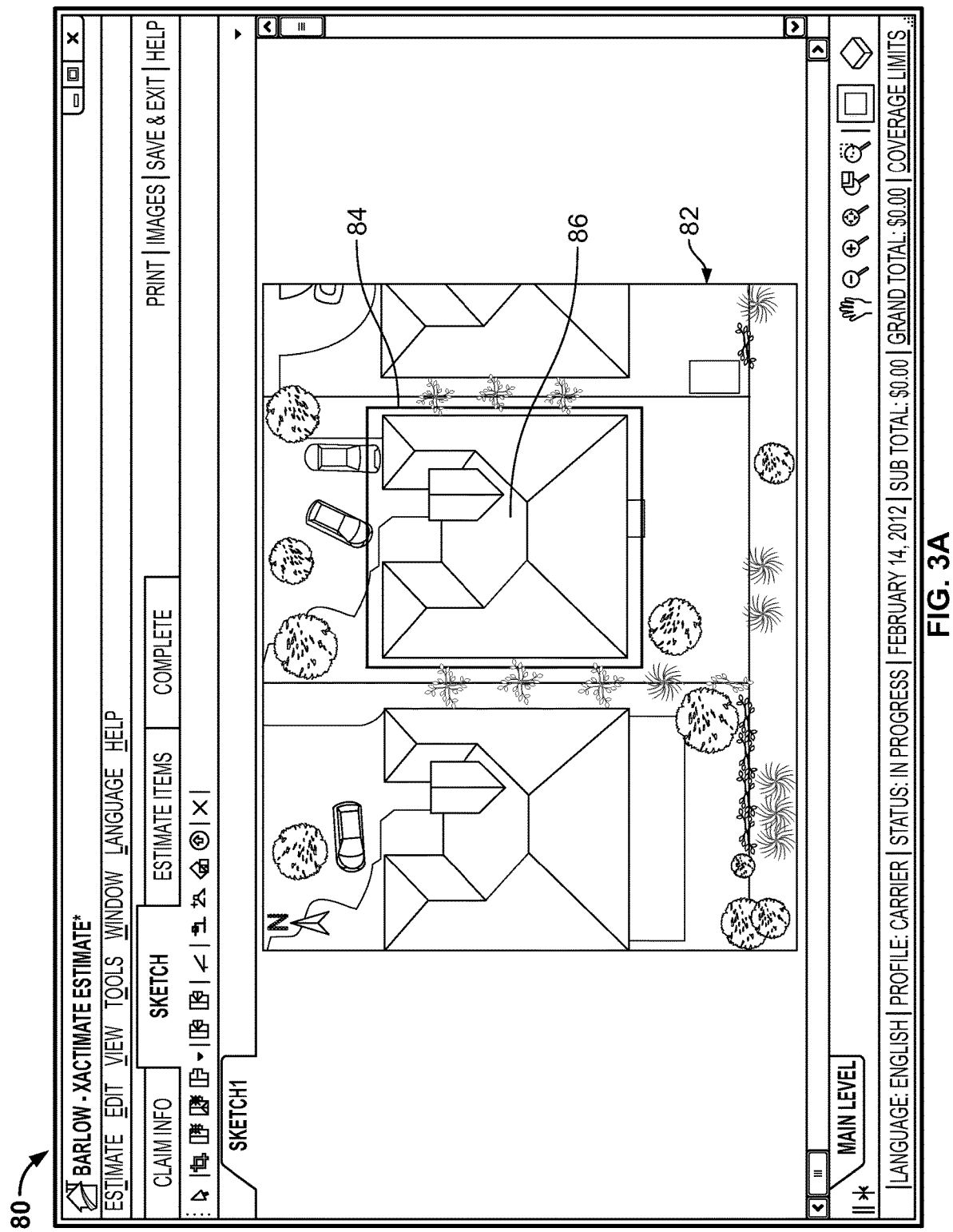
FIGS. 3A-3L are screenshots showing operation of the system of the present invention in detail.
Figure 3B:
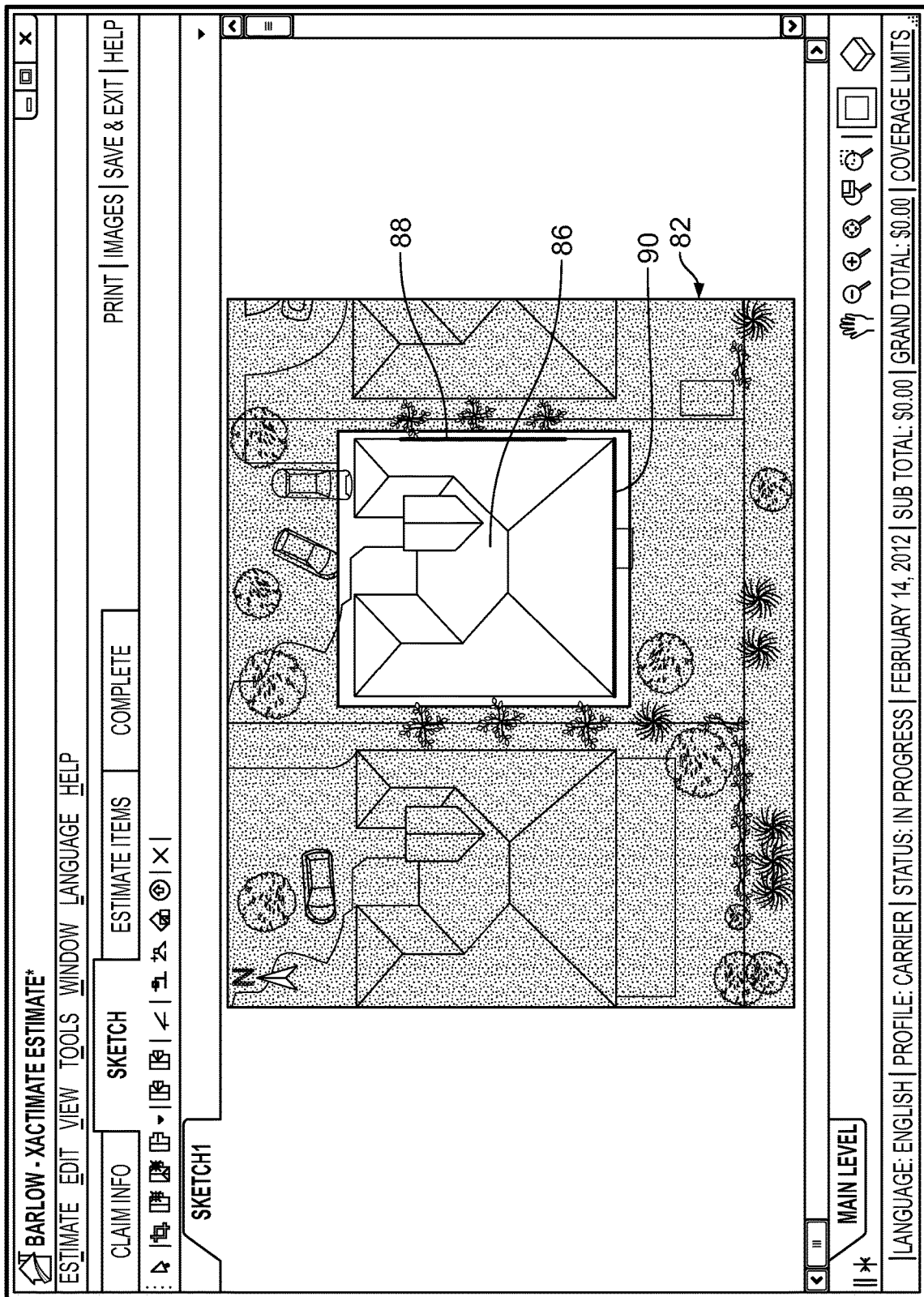

FIG. 2 is a flowchart showing overall processing steps 40 carried out by the estimation engine 16 of the system 10. Reference is also made herein to FIGS. 3A-4B, which are views showing operation of the estimation engine 16. Beginning in step 42, as shown in FIG. 3A, a graphical user interface 80 is generated by the estimation engine 16 and presented to a user to allow the user to select an aerial image 82 of a building or structure, preferably from the aerial image database 14. Then, in step 44, the user can crop the image 82 by selecting a roof 86 from the image 82 using a selection tool 84 of the graphical user interface 80, e.g., by creating a box around the desired area. In step 46, as shown in FIG. 3B, the estimation engine 16 automatically rotates the roof 86 of the cropped image 82 so that the image 82 is aligned vertically and horizontally using roof lines 88, 90.

Figure 5:
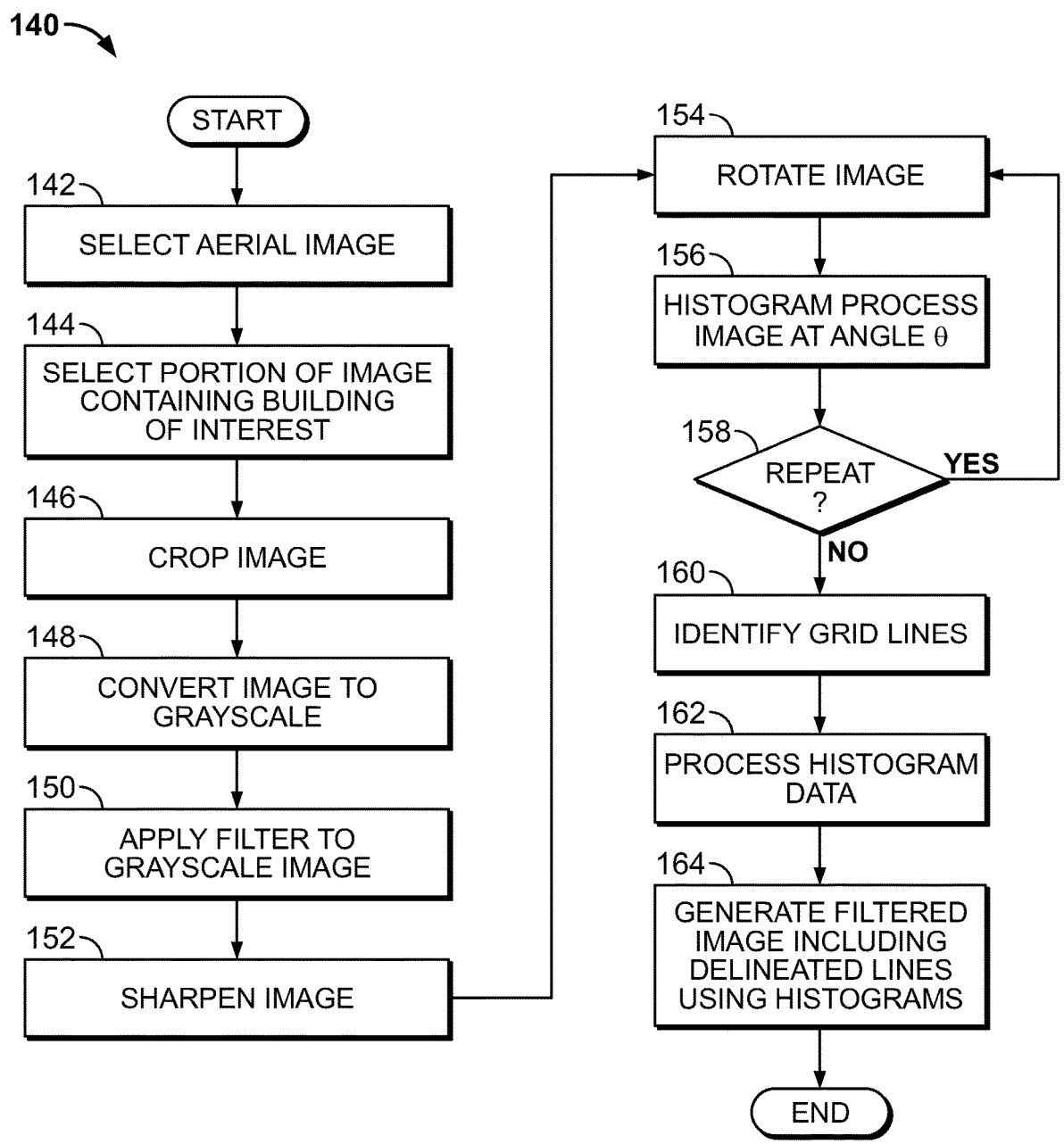
FIG. 5 is a flowchart showing processing steps carried out by the present invention for processing an aerial image to automatically identify roof lines.

The process for aligning the image 82 is described as follows. First, the processing steps discussed in detail below in connection with FIG. 5 are carried out to automatically identify perimeter and interior roof lines in the image. Using this information, a sequence of points are identified in each direction (e.g., 360 degrees) and are defined as rays in the set {raycast}, and include top ray {top}, bottom ray {bottom}, left ray {left}, and right ray {right}. Then, for each ray in the set {raycast}, the sequence of points are divided into |raycast|−2 subsets of two sequences made up of points {{0 . . . 1}, {2 . . . |raycast|−1}}, {{0 . . . 2}, {3 . . . |raycast|−1} } to {{0−|raycast| . . . 3}, {|raycast|−2 . . . |raycast|−1}} where |raycast| is the length of the sequence and 0 . . . 1 is the indices of the first and second point and 2 . . . |raycast|−1 is the remaining points in the sequence. For each of these subsequences {{0 . . . n}, {n+1 . . . |raycast|−1}}, the two point sets are treated as plots and their linear slope is found using linear regression. The difference between slopes is found, and only the maximum difference is retained. After iterating through every subsequence in the set {raycast}, if the maximum difference is greater than a specified threshold, the sequence is split at that point and the process is recursively repeated for each of the subsequences. Once all subsequences can no longer be divided, the length and slope of each subsequence is cached for further use. Finally, slopes are identified which are similar, and their lengths are combined. The slopes are then used to identify the roof lines 88, 90, which are then used to align the image 82 vertically and horizontally.

Figure 3C:
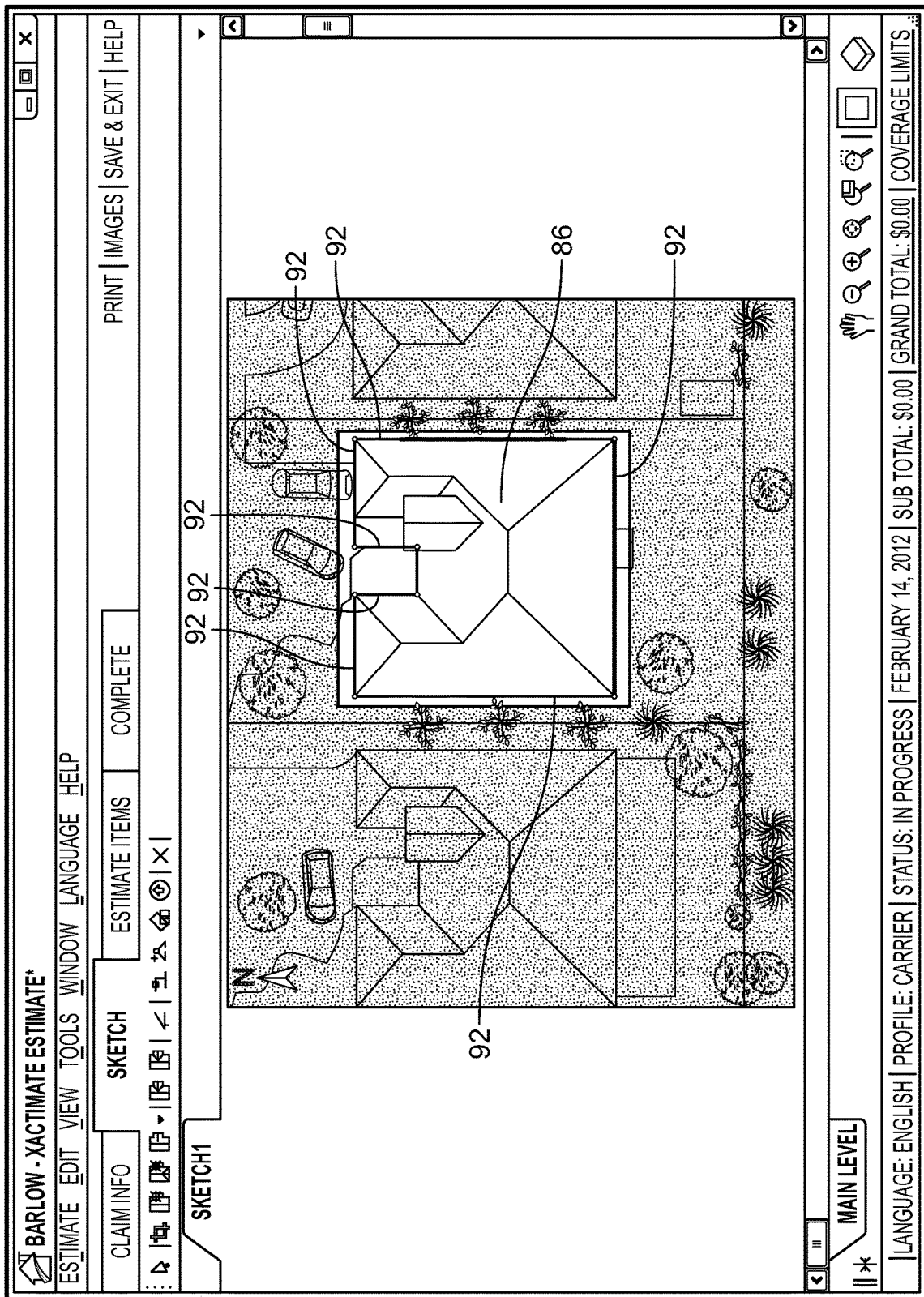
Figure 3D:
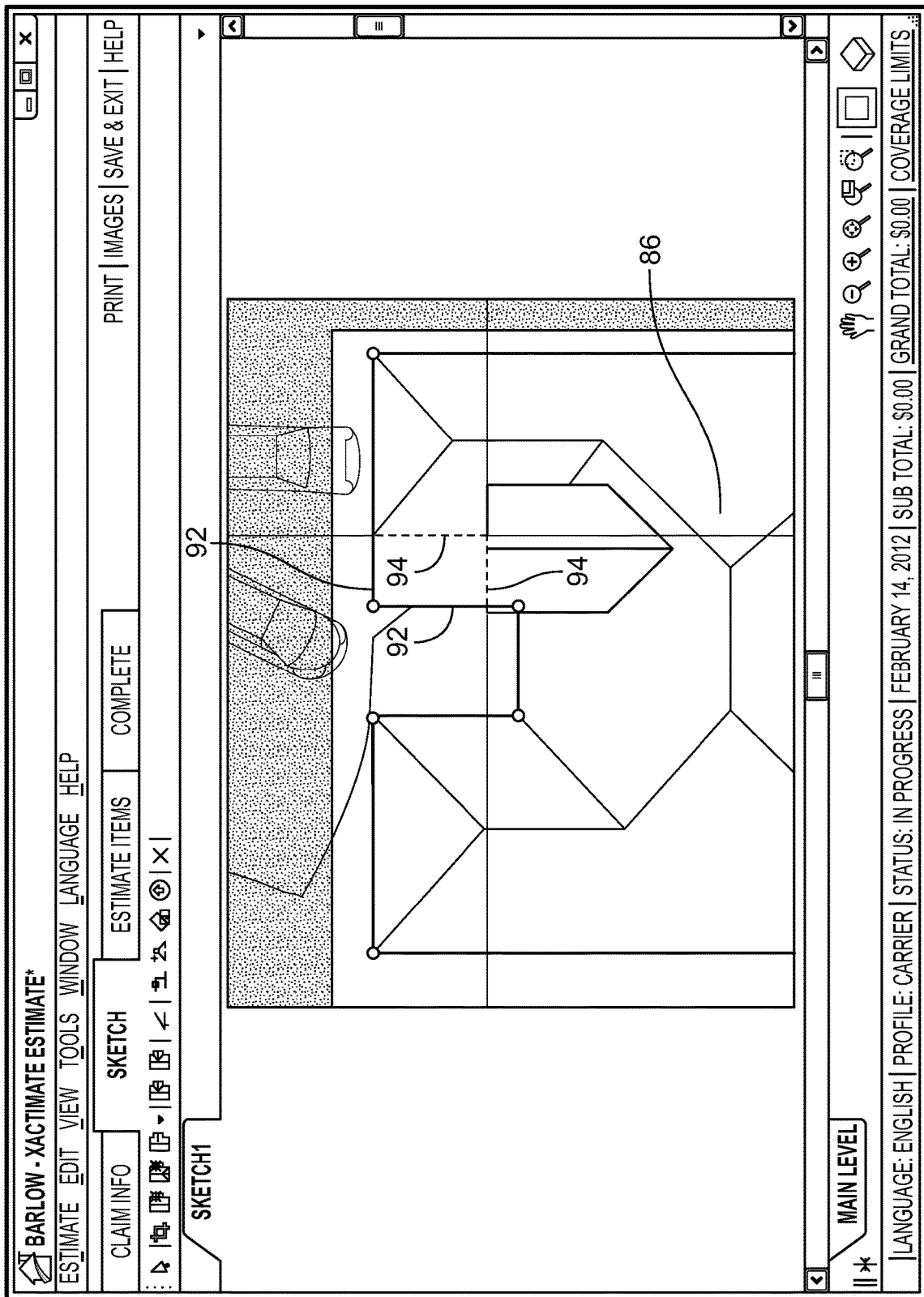

Then in step 48, as shown in FIG. 3C, the estimation engine 16 uses image processing algorithms to automatically identify and delineate perimeter lines 92 of the roof 86 to form a closed polygon or a bounded area. In step 50, a user decides whether the estimation engine 16 has correctly identified the perimeter lines 92 or whether adjustments or alterations must be made. If alterations are required, step 52 occurs where, as shown in FIG. 3D, the user manually adjusts the perimeter lines 92 to create corrected perimeter lines 94, such as by clicking on the corners of the roof 86 that were not correctly identified automatically. As the user clicks on or moves the cursor toward a roof feature (e.g., a corner), the estimation engine 16 could automatically suggest potential changes to the outline of the perimeter, by way of dashed lines 94 as shown in FIG. 3D. The user can confirm changes by clicking on the dashed lines 94, which converts the dashed lines to solid lines.

Figure 3E:
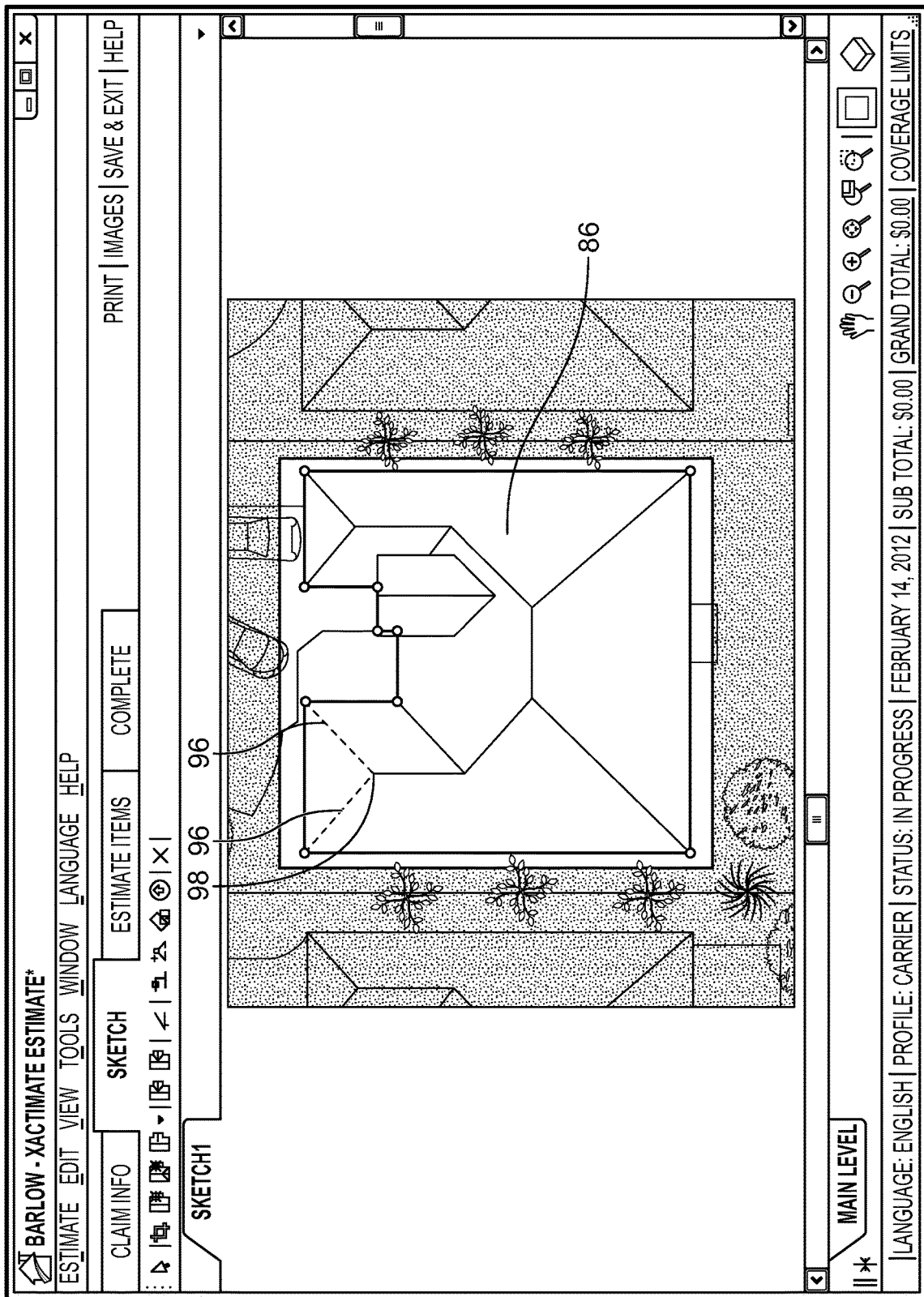
Figure 3F:
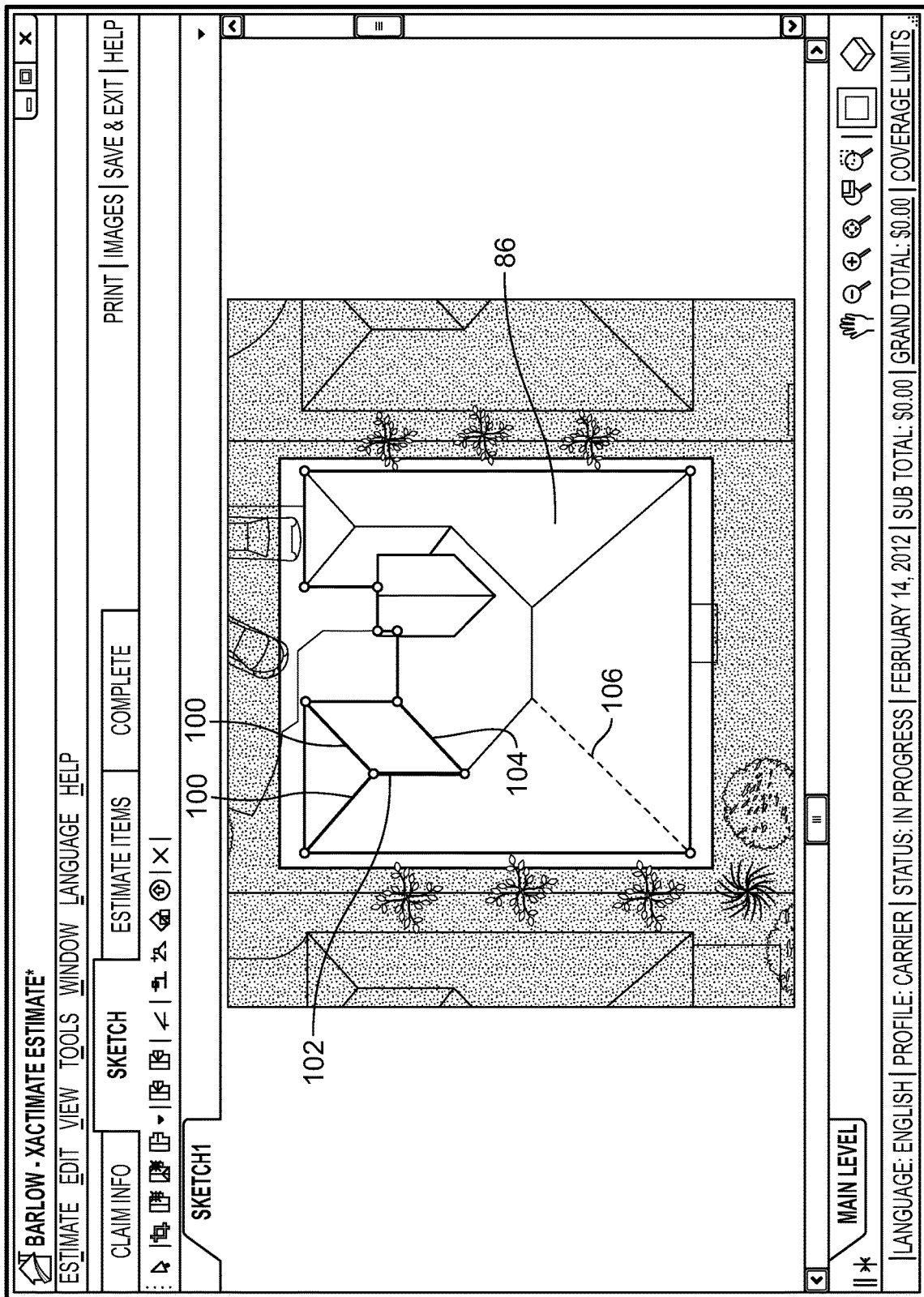

After perimeter line alterations have been made, or if no alterations are determined to be needed in step 50, the process proceeds to step 54 where, as shown in FIG. 3E, the estimation engine 16 automatically identifies and delineates interior lines 96 (e.g., ridges and valleys) and interior intersections 98 of the roof 86. Different roof features can be identified and distinguished using lines of different colors (e.g., ridges as red lines, valleys as blue lines, etc.). The user can move the mouse cursor over certain sections of the roof, such as intersection 98, and the system evaluates that section (e.g., by evaluating the proximity and configuration of existing adjacent points and other detected and identified lines) and automatically delineates colored dashed lines 96 as suggestions for lines to be included in the model. The user can then confirm the line, change the type of line, or reject the line. Once confirmed by the user, the dashed lines 96 are converted to solid lines 100, as shown in FIG. 3F. In step 56, a determination is made as to whether all lines have been found. If a negative determination is made, step 54 is repeated. Otherwise, if all lines have been identified (e.g., including the lines 102, 104, 106 in FIG. 3F, as well as any other lines corresponding to roof structures), a two-dimensional wireframe of the roof is created based on the perimeter lines and interior lines discussed above.

Figure 3G:
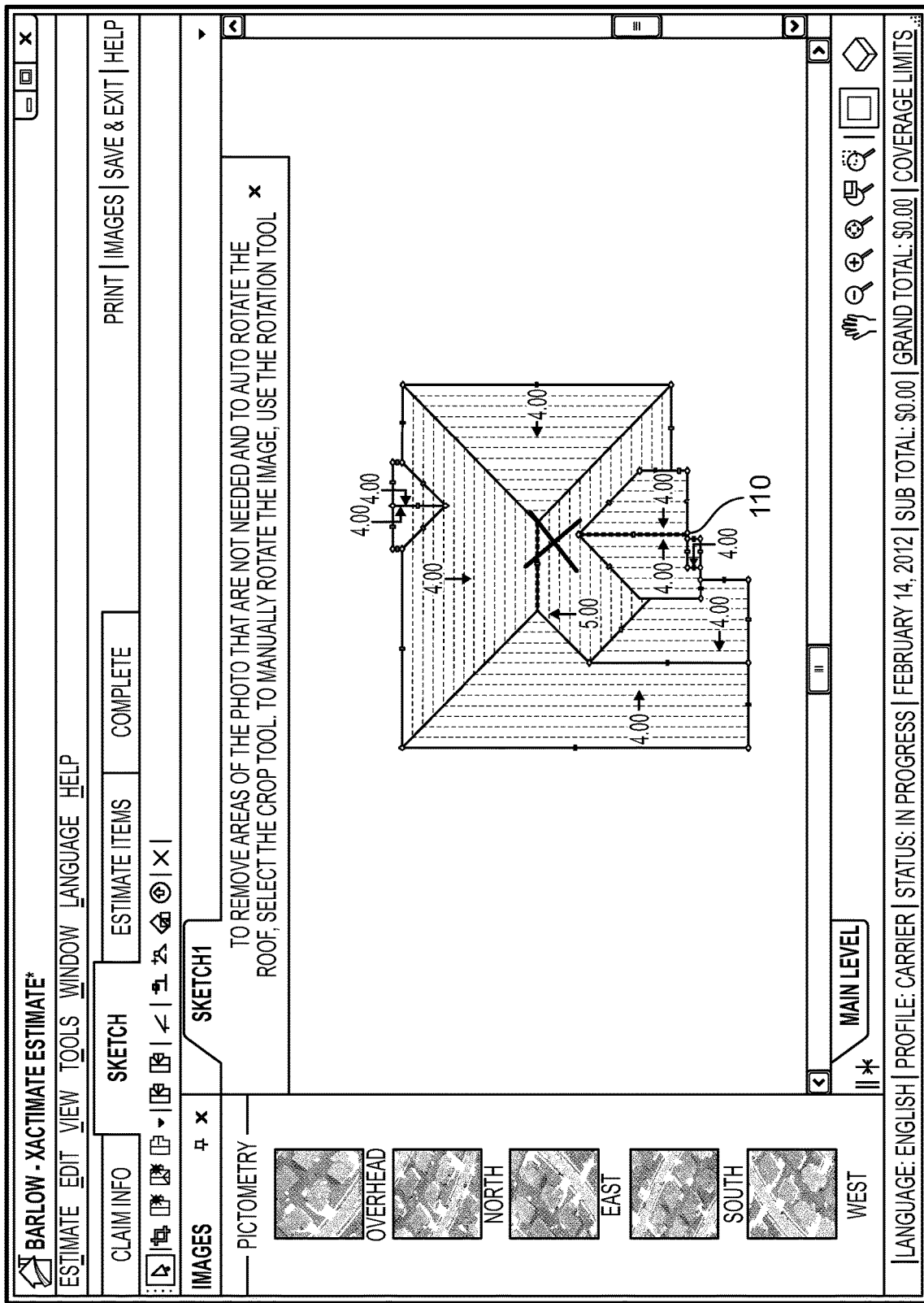
Figure 3H:
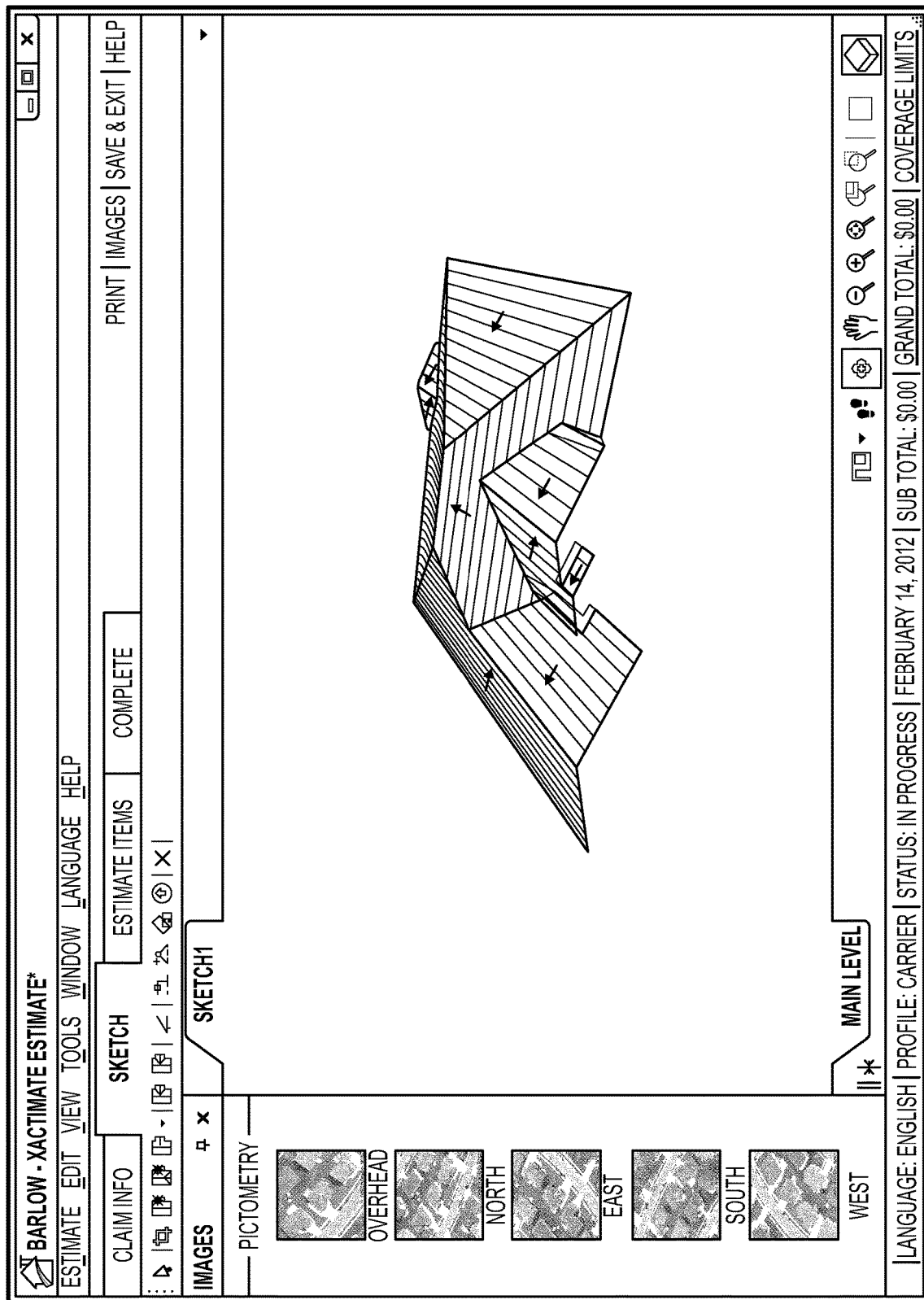

The two-dimensional model 110 is shown in FIG. 3G. The model 110 can be processed, either automatically by the engine 16 or through manual user manipulation, into a three-dimensional model. Thus, in step 59, a decision is made as to whether to automatically or manually create the three-dimensional model. If automatic creation is to be performed, a three-dimensional wireframe of the roof is created in step 61, based on the perimeter lines and interior lines. In this regard, the estimation engine 16 creates closed polygon surfaces, as shown in FIG. 3G, that represent the roof faces, and then calculates and assigns an orientation (e.g., direction of slope) based on roof constraints for each face. Using a center of mass calculation, the engine 16 selects a prominent face and assigns it a default slope. The slopes of the other faces are then iteratively calculated by the engine 16 based on constraints imposed by the relationship of lines between adjacent faces and orientations of the faces. Also, the user can manually enter a slope for a specific face and the engine 16 will recalculate the slope of the adjacent faces based on the manual slope entry. A three dimensional wireframe model is then created based on the slopes, as shown in FIG. 3H. The process then proceeds to step 70 discussed below.

Figure 3J:
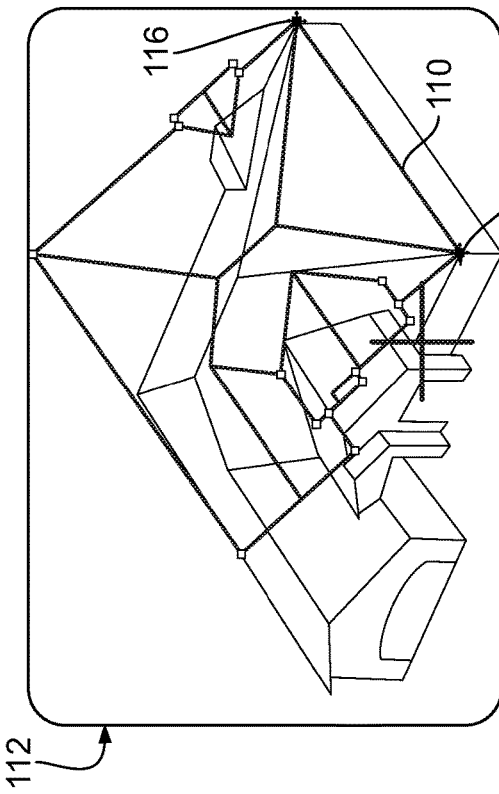
Figure 3L:
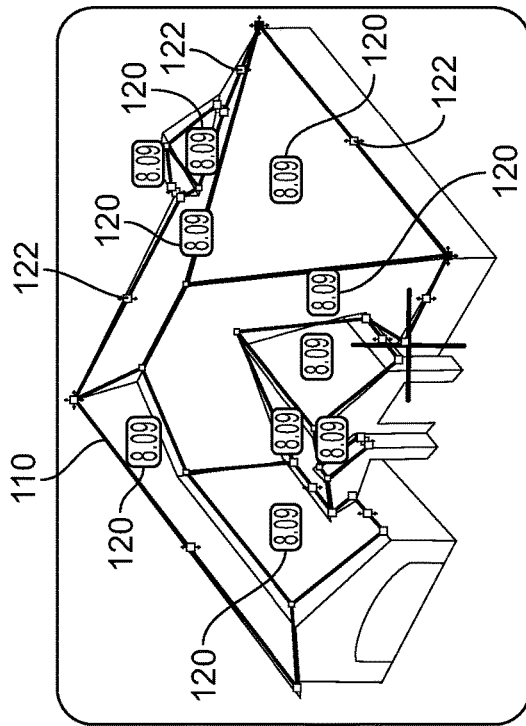
Figure 3I:
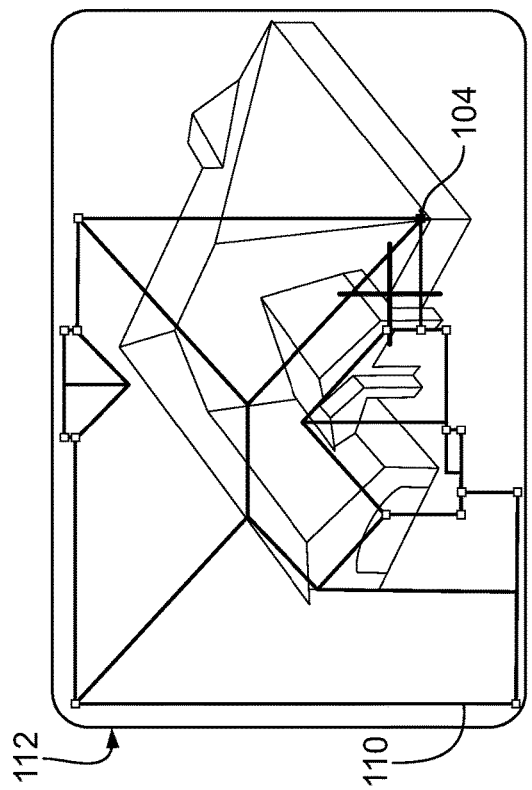
Figure 3K:
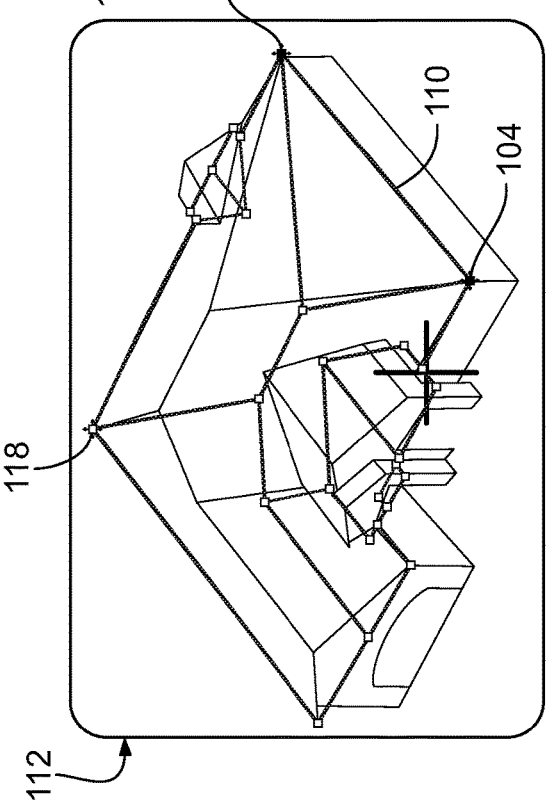

If manual creation of the three-dimensional model is to be performed, the process proceeds to step 60, as shown in FIG. 3I, where an oblique image 112 is selected, preferably from the aerial database 14. Then, in step 62, the wireframe 110 is superimposed over the oblique image 112 either by the user or automatically by the estimation engine 16. Then in step 64, as shown in FIGS. 3J-3K, a plurality of points on the wireframe 110 are matched with a plurality of corresponding points on the roof 86 of the oblique image 112, and the wireframe 110 is deformed as a result. The plurality of points could be on eave edges and/or at the same eave height. For example, a user could match three corners 104, 116, 118 of the wireframe 110 with three corresponding points of the roof 86 in the oblique image 112, causing the wireframe 110 to deform accordingly. Then, the user clicks and drags the interior points of the wireframe 110 to corresponding locations on the roof 86 of the oblique image 112 (e.g., the ridge lines of the roof 86), until the wireframe 110 outlines all of the perimeter lines and interior lines of the roof 86 in the oblique image 112. It is noted that this process could also be carried out automatically by the estimation engine 16. The final, deformed wireframe is shown in FIG. 3L. In step 66, the estimation engine 16 calculates roof pitches 120 based on the deformations of the superimposed wireframe 110, as shown in FIG. 3L.

In step 68, a user could optionally set eave heights to fine-tune the wireframe 110, and the estimation engine 16 would recalculate pitches based thereon. For example, the user could use an eave edit handle 122 on the midpoint of each eave line of the wireframe 110 to adjust the slope of one or more faces of the wireframe 110 by clicking and dragging. Alternatively, the user could click and drag the entire wireframe 110 until the eave line of the wireframe 110 overlays the eave line of the roof 86 of the oblique image 112.

Figure 4A:
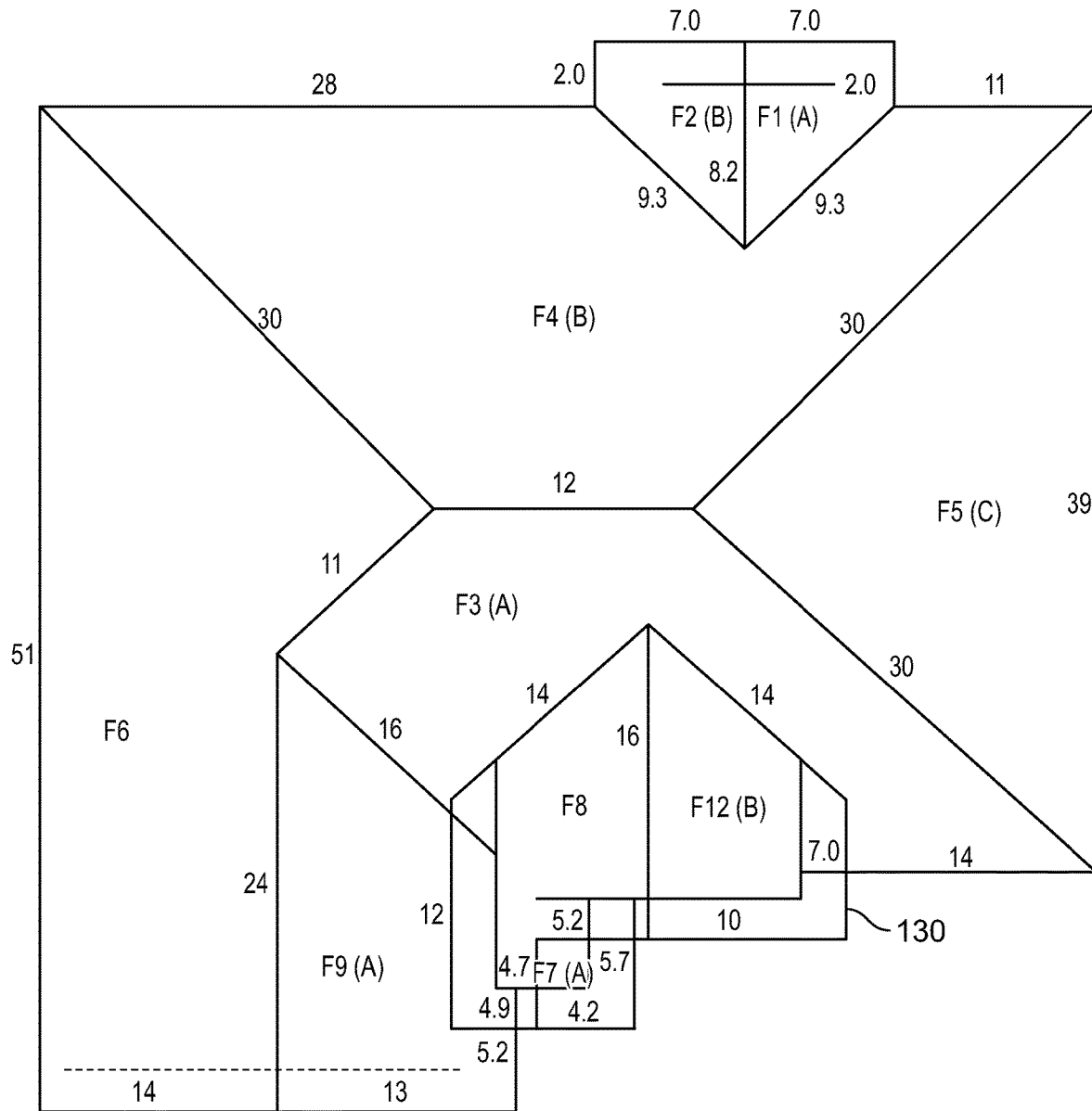
FIGS. 4A-4B are views of a sample estimation report generated by the present invention.
Figure 4B:
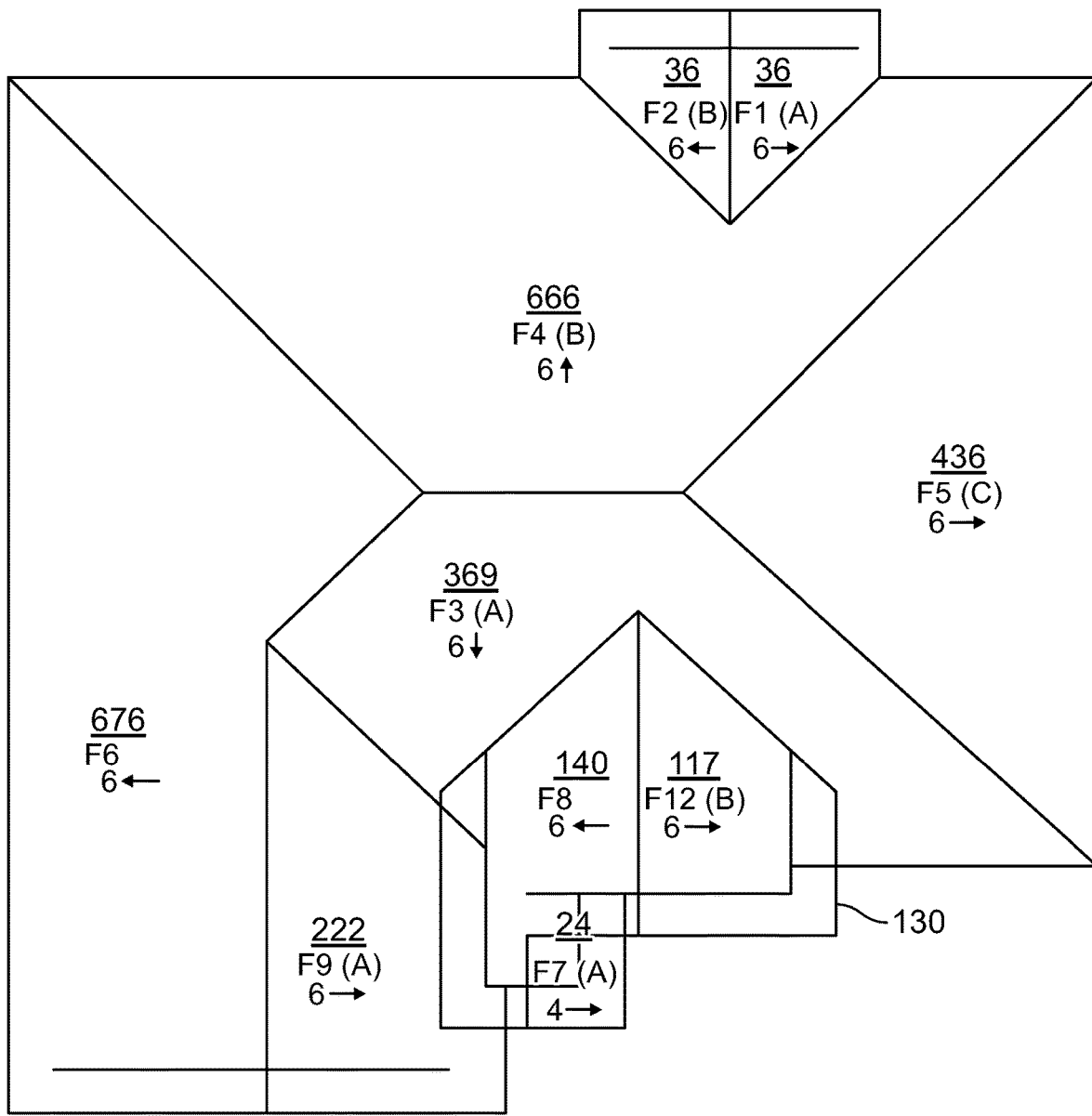

Proceeding to step 70, as shown in FIGS. 4A-4B, the system 10 generates a report. The report could comprise a two-dimensional wireframe model 130, a three-dimensional model, and/or one or more charts 132 containing construction information (e.g., roof dimensions, pitches, surfaces, and areas, and associated material costs). Other types of information, such as waste calculations, could also be included in the report. The report could have an XML flag as a way to verify that a roof model was created by the system 10. The system 10 could also require that a model have an XML flag before including the model in the report or before automatically generating the report.

Figure 6B:
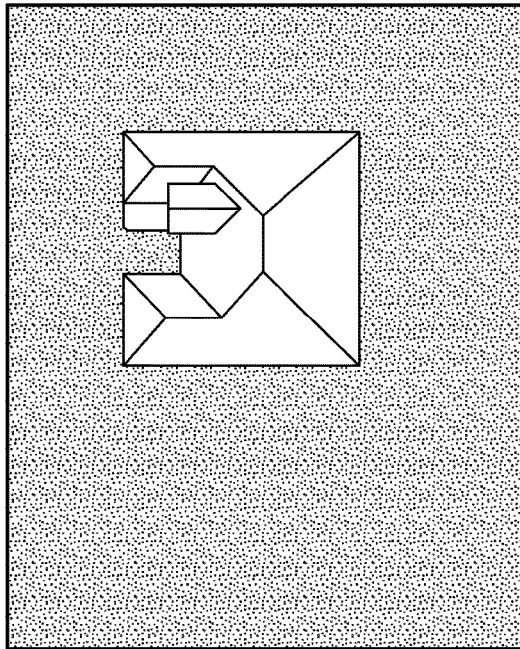
FIGS. 6A-6K are views illustrating the steps of FIG. 5 for processing an aerial image to automatically identify roof lines.
Figure 6D:
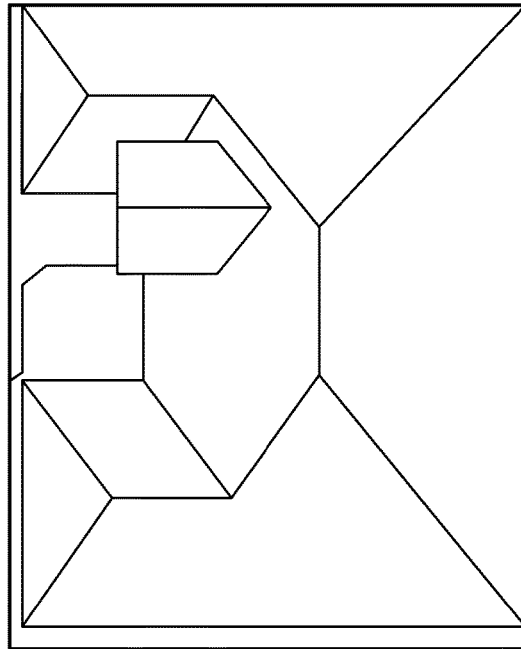
Figure 6A:
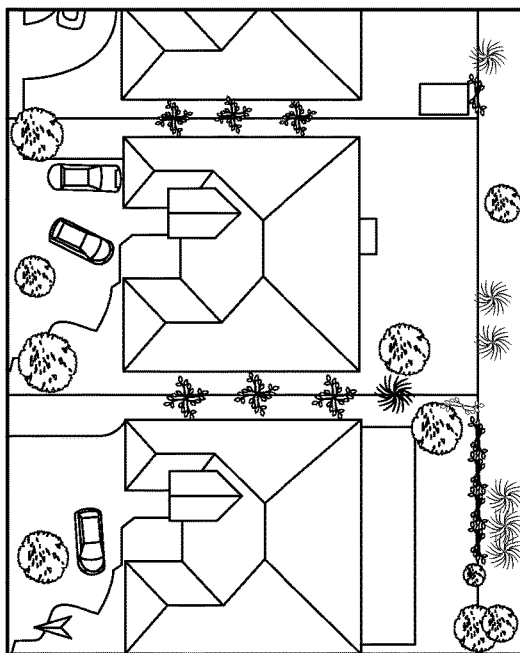
Figure 6C:
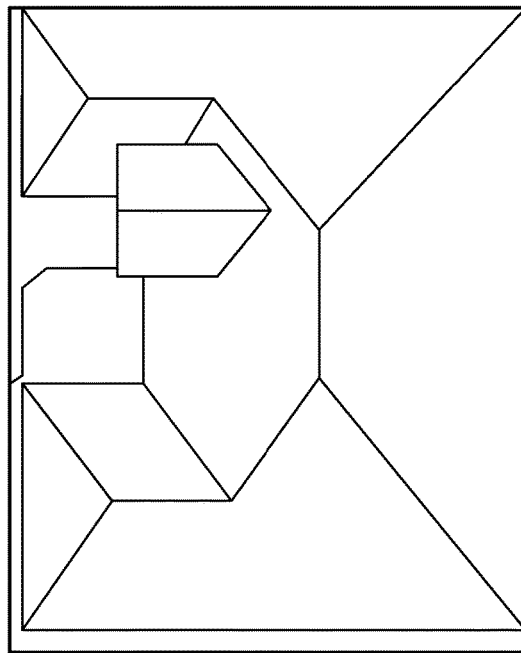
Figure 6E:
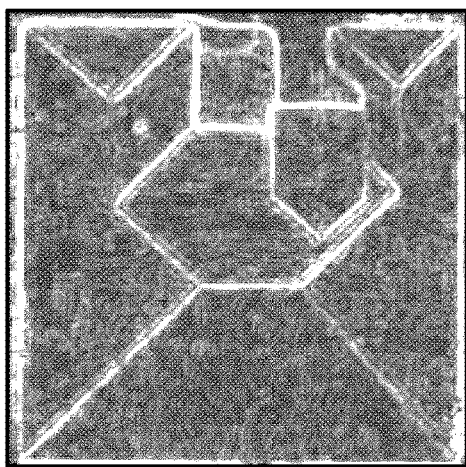
Figure 6F:
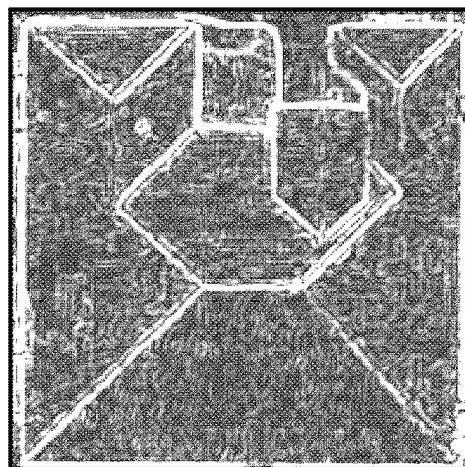

FIG. 5 is a flowchart showing more detailed processing steps 140 carried out by the estimation engine 16 for processing an aerial image to automatically identify roof lines. Reference is also made herein to FIGS. 6A-6K, which are views illustrating the steps carried out in FIG. 5. Beginning with step 142, as shown in FIG. 6A, an aerial image is selected. A portion of the image containing the roof is selected in step 144, as shown in FIG. 6B, and the image is then cropped in step 146, as shown in FIG. 6C. The image is then converted to grayscale in step 148, as shown in FIG. 6D. In step 150, as shown in FIG. 6E, a filter is applied to the grayscale image, such as a Sobel filter, although it is noted that a filter could be applied without first converting the image to grayscale. The Sobel filter calculates the gradient of image intensity at each point in the image, giving a direction and rate of change to the largest increases from light to dark. The estimation engine 16 computes the likelihood that a point in the image represents a perimeter or interior line of a roof based on the direction and magnitude of the greatest intensity increase. In step 152, as shown in FIG. 6F, a Gaussian filter or blur could be applied to the image to decrease blur and/or sharpen the image.

Figure 6G:
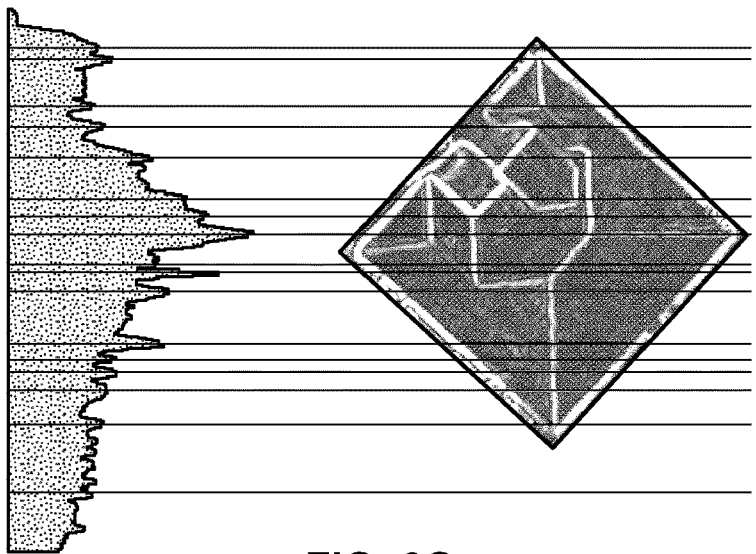
Figure 6H:
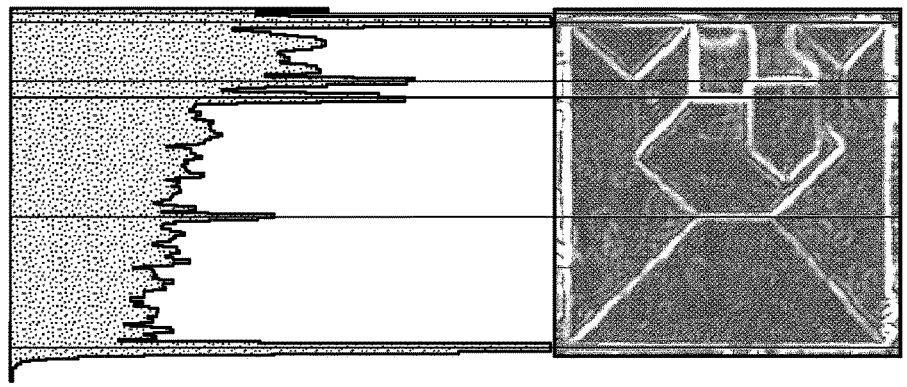
Figure 6I:
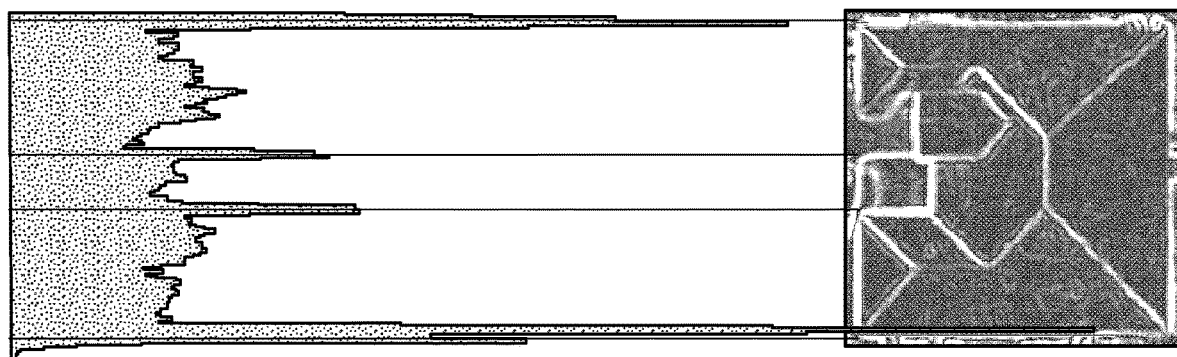

In step 154, as shown in FIG. 6G, the image is rotated by a first angle θ (e.g., 48 degrees), as shown in FIG. 6G, and then histogram processing is performed on the rotated image in step 156. The horizontal lines shown in FIGS. 6G-6I correspond to the direction of scan for image intensity. In step 158, a determination is made as to whether further histogram processing is required. If so, the process repeats until the image has been processed at a sufficient number of angles. It has been found that histograms taken at one degree increments (e.g., from 0 through 360 degrees) have provided excellent results, but other increments and/or number of histograms used are possible. Indeed, as shown in FIG. 6H, the image could be rotated to align vertically and then histogram processed, and/or the image could be rotated to align horizontally and then histogram processed, as shown in FIG. 6I. Of course any other angles could be used.

Figure 6J:
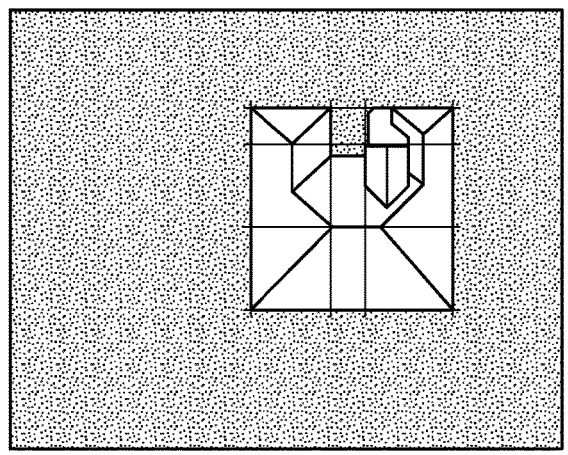

In step 160, as shown in FIG. 6J, grid lines could be superimposed on the image, such as at perimeter lines, interior lines, and/or points of intersection. The grid lines can be used to segment/divide the image into sub-images, each of which are processed in accordance with the present invention. The grid lines need not be shown to the user, and indeed, can be used solely for purposes of image processing.

Figure 6K:
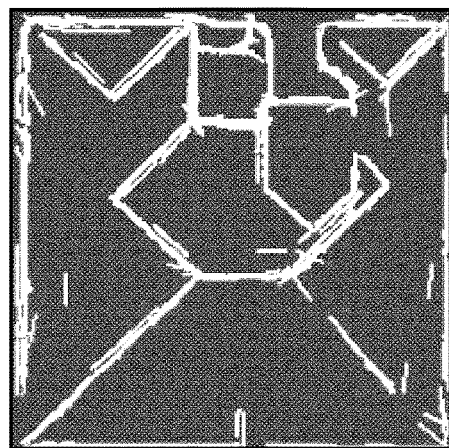

The histograms generated at the plurality of angles indicate the probability that a given feature in the image corresponds to a line (e.g., to a perimeter line or to an interior line corresponding a roof feature). In step 162, the histogram data (e.g., all of the histograms generated in steps 156-158) is processed to identify lines (e.g., perimeter and interior lines) corresponding to roof features. For example, in step 162, cluster analysis could be performed on the histograms to identify the lines (e.g., perimeter or interior lines). Thus, by application of the foregoing image processing techniques, the estimation engine 16 can scan the entire image and detect and identify all perimeter and interior lines. Finally, in step 164, as shown in FIG. 6K, a filtered image is generated and used by the estimation engine 16 to automatically delineate perimeter lines and interior lines in the GUI 80 shown in FIGS. 3A-3F.

As noted above, the estimation engine 16 can automatically identify the type of roof feature to which a given line in the model corresponds. This is accomplished by rules-based pattern recognition performed by the estimation engine 16, which could vary according to the type of roof feature to be automatically identified. For example, a set of rules could be programmed into the estimation engine 16 such that a ridge or a valley is automatically identified for a given point on the image if specific lines are detected in proximity to a given point in the image and/or if a pre-defined angle (or, range of angles) is detected between such lines. If the estimation engine 16 is unable to identify the type of line, the line could be temporarily marked as unknown and automatically altered by the estimation engine 16 as more information becomes available. Subsequently, the user could then manually correct the lines and line types if required.

Having thus described the invention in detail, it is to be understood that the foregoing description is not intended to limit the spirit or scope thereof. What is desired to be protected is set forth in the following claims.

What is claimed is:

1. A system for construction estimation, comprising:
a memory for storing at least one aerial image of a building; and
a processor in communication with the memory, the processor:
receiving, from the memory, the at least one aerial image;
processing the at least one aerial image to automatically identify a plurality of perimeter lines and interior lines in the at least one aerial image corresponding to one or more features of a roof of the building;
constructing a two-dimensional wireframe model of the roof based on the identified plurality of perimeter lines and interior lines; and
automatically generating a three-dimensional wireframe model of the roof of the building based on the constructed two-dimensional wireframe model by creating at least one closed polygon representing a roof face from the two-dimensional wireframe model of the roof and assigning a three-dimensional orientation to the at least one closed polygon surface based on at least one roof constraint associated with the roof face.

2. The system of claim 1, further comprising a graphical user interface for displaying the at least one aerial image of the building.

3. The system of claim 1, wherein the plurality of interior lines in the at least one aerial image correspond to one or more of an eave, a hip, a ridge, a valley and an interior intersection of the roof of the building.

4. The system of claim 1, wherein the processor generates a report comprising construction information associated with the generated three-dimensional wireframe model of the roof, the construction information being indicative of one or more of roof dimensions, pitches, surfaces, areas, and material costs associated with the roof.

5. The system of claim 1, wherein the processor crops the at least one aerial image around the building.

6. The system of claim 1, wherein the processor allows a user to adjust one or more of the automatically identified plurality of perimeter and interior lines via the graphical user interface.

7. A method for construction estimation, comprising the steps of:
receiving, by a processor, at least one aerial image of a building;
processing the at least one aerial image to automatically identify a plurality of perimeter lines and interior lines in the at least one aerial image corresponding to one or more features of a roof of the building;
constructing a two-dimensional wireframe model of the roof based on the identified plurality of perimeter lines and interior lines; and
automatically generating a three-dimensional wireframe model of the roof of the building based on the constructed two-dimensional wireframe model by creating at least one closed polygon representing a roof face from the two-dimensional wireframe model of the roof and assigning a three-dimensional orientation to the at least one closed polygon surface based on at least one roof constraint associated with the roof face.

8. The method of claim 7, further comprising generating and displaying a graphical user interface for displaying the at least one aerial image of the building.

9. The method of claim 7, further comprising generating a report comprising construction information associated with the generated three-dimensional wireframe model of the roof, the construction information being indicative of one or more of roof dimensions, pitches, surfaces, areas, and material costs associated with the roof.

10. The method of claim 7, further comprising cropping the at least one aerial image around the building.

11. The method of claim 7, further comprising allowing a user to adjust one or more of the automatically identified plurality of perimeter and interior lines via a graphical user interface.

12. A non-transitory, computer-readable medium having computer-readable instructions stored thereon which, when executed by a processor, causes the processor to perform the steps comprising:
receiving, by the processor, at least one aerial image of a building;
processing the at least one aerial image to automatically identify a plurality of perimeter lines and interior lines in the at least one aerial image corresponding to one or more features of a roof of the building;
constructing a two-dimensional wireframe model of the roof based on the identified plurality of perimeter lines and interior lines; and
automatically generating a three-dimensional wireframe model of the roof of the building based on the constructed two-dimensional wireframe model by creating at least one closed polygon representing a roof face from the two-dimensional wireframe model of the roof and assigning a three-dimensional orientation to the at least one closed polygon surface based on at least one roof constraint associated with the roof face.

13. The non-transitory, computer-readable medium of claim 12, further comprising computer-readable instructions for causing the processor to perform the steps of generating and displaying a graphical user interface for displaying the at least one aerial image of the building.

14. The non-transitory computer-readable medium of claim 12, further comprising computer-readable instructions for causing the processor to perform the steps of generating a report comprising construction information associated with the generated three-dimensional wireframe model of the roof, the construction information being indicative of one or more of roof dimensions, pitches, surfaces, areas, and material costs associated with the roof.

15. The non-transitory computer-readable medium of claim 12, further comprising computer-readable instructions for causing the processor to perform the steps of cropping the at least one aerial image around the building.

16. The non-transitory computer-readable medium of claim 12, further comprising allowing a user to adjust one or more of the automatically identified plurality of perimeter and interior lines via a graphical user interface.

\* \* \* \* \*

UNITED STATES PATENT AND TRADEMARK OFFICE
CERTIFICATE OF CORRECTION

PATENT NO. : 11,727,163 B2
APPLICATION NO. : 17/560718
DATED : August 15, 2023
INVENTOR(S) : Loveland et al.

It is certified that error appears in the above-identified patent and that said Letters Patent is hereby corrected as shown below:

On the Title Page

On page 2, under item (56) the References Cited U.S. Patent Documents, Column 1:
U.S. Patent No. 6,434,277, "Kamada et al." should be deleted and replaced with "Yamada et al."
U.S. Patent No. 6,982,712, "Onto" should be deleted and replaced with "Ohto"

On page 6, under item (56) References Cited Other Publications, the tenth reference down the second column, the word "Chapters:" should be deleted and replaced with "Chapter 5:"

Signed and Sealed this
Nineteenth Day of December, 2023

Katherine Kelly Vidal
*Director of the United States Patent and Trademark Office*